US012744515B2

(12) United States Patent
Suh et al.

(10) Patent No.: US 12,744,515 B2
(45) Date of Patent: Sep. 22, 2026

(54) CIRCUIT FOR ATTENUATING SIGNAL RECEIVED THROUGH ANTENNA TO IMPROVE SNR, ELECTRONIC DEVICE INCLUDING THE SAME, AND METHOD FOR CONTROLLING THE SAME

(71) Applicant: Samsung Electronics Co., Ltd., Suwon-si (KR)

(72) Inventors: Bosung Suh, Suwon-si (KR); Byoungjoong Kang, Suwon-si (KR); Heeyong Yoo, Suwon-si (KR); Beomyu Park, Suwon-si (KR); Jeongyeol Bae, Suwon-si (KR); Sangmin Yoo, Suwon-si (KR); Jongsoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 204 days.

(21) Appl. No.: 18/810,639

(22) Filed: Aug. 21, 2024

(65) Prior Publication Data

US 2025/0070759 A1 Feb. 27, 2025

(30) Foreign Application Priority Data

Aug. 22, 2023 (KR) ........................ 10-2023-0110105
Feb. 19, 2024 (KR) ........................ 10-2024-0023435

(51) Int. Cl.
*H03H 11/24* (2006.01)
*H03F 1/12* (2006.01)
(Continued)

(52) U.S. Cl.
CPC ............. *H03H 11/24* (2013.01); *H03G 3/001* (2013.01); *H03H 17/0054* (2013.01);
(Continued)

(58) Field of Classification Search
CPC ......... H03F 2200/451; H03F 2200/294; H03F 3/245; H03F 3/19; H03F 3/72;
(Continued)

(56) References Cited

U.S. PATENT DOCUMENTS 4,531,234 A * 7/1985 Bell ........................ H04B 1/18
455/249.1
7,061,993 B2 6/2006 Wieck
(Continued)

FOREIGN PATENT DOCUMENTS

KR 10-20010104436 A 11/2001

OTHER PUBLICATIONS

Kim, N. et al., "A Resistively Degenerated Wide-Band Passive Mixer with Low Noise Figure and +60dBm IIP2 in 0.18? m CMOS", 2008 IEEE Radio Frequency Integrated Circuits Symposium, pp. 185-188.

*Primary Examiner* — Golam Sorowar
(74) *Attorney, Agent, or Firm* — Fish & Richardson P.C.

(57) ABSTRACT

An electronic device includes an amplifier circuit configured to amplify a radio frequency (RF) signal received from an antenna, the RF signal having a receiving power, an attenuator circuit connected between the amplifier circuit and a mixer, the attenuator circuit including at least one resistor and at least one transistor, and a processor configured to turn on a first transistor among the at least one transistor based on the receiving power being less than a threshold value, a signal output from the amplifier circuit being directly transferred to the mixer based on the first transistor being turned on, and control one or more transistors among the at least one transistor using a look-up table based on the receiving power being greater than or equal to the threshold value, the
(Continued)

attenuator circuit having a resistance value corresponding to the receiving power based on the control of the one or more transistors.

20 Claims, 14 Drawing Sheets

(51) Int. Cl.
*H03G 3/00* (2006.01)
*H03H 17/00* (2006.01)
*H04B 1/04* (2006.01)

(52) U.S. Cl.
CPC ......... *H04B 1/0475* (2013.01); *H04B 1/0483* (2013.01); *H03F 1/12* (2013.01); *H03F 2200/294* (2013.01); *H03F 2200/451* (2013.01); *H04B 2001/0408* (2013.01)

(58) Field of Classification Search
CPC .......... H03F 3/193; H03F 1/223; H03F 3/195; H03F 3/45475; H03F 1/565; H03F 2200/211; H03F 2200/411; H03F 2203/7236; H03F 1/0277; H03F 1/26; H03F 3/189; H03F 3/211; H03F 2200/222; H03F 1/22; H03F 1/3205; H03F 2200/372; H03F 2203/7206; H03F 2200/171; H03F 2200/465; H03F 3/45179; H03F 2200/61; H03F 2200/06; H03G 1/0088; H03G 3/3052; H03G 3/3068; H03G 3/3042; H03G 1/0029; H03G 3/3036; H03G 2201/103; H03G 1/0023; H03G 2201/307; H03G 3/3063; H03G 3/3078; H03G 2201/206; H03G 3/001; H03G 3/30; H03G 1/0035; H03G 3/008; H03G 2201/106; H03G 7/001; H03G 1/007; H04B 1/18; H04B 1/44; H04B 1/109; H04B 1/0475; H04B 1/123; H04B 1/30; H04B 1/40; H04B 2001/0416; H04B 1/04; H04B 1/16; H04B 1/1615; H04B 1/48; H04B 17/13; H04B 2001/04; H04B 1/0003; H04B 1/0057; H04B 1/0078; H04B 1/0458; H04B 1/1036; H04B 1/1081
See application file for complete search history.

(56) References Cited

U.S. PATENT DOCUMENTS

| | | | | |
|---|---|---|---|---|
| 7,304,969 | B2 * | 12/2007 | Ryan | H03G 3/3078 370/332 |
| 7,899,426 | B2 | 3/2011 | Tasic et al. | |
| 9,692,471 | B2 | 6/2017 | Lien et al. | |
| 9,729,119 | B1 * | 8/2017 | Blatz | H03G 3/3036 |
| 11,277,119 | B2 * | 3/2022 | Ryu | H03H 7/25 |
| 11,290,076 | B2 | 3/2022 | Beppu | |
| 12,500,807 | B2 * | 12/2025 | Hsieh | H04B 1/04 |
| 2011/0294448 | A1 * | 12/2011 | Vauhkonen | H03G 3/3068 455/232.1 |
| 2023/0089220 | A1 | 3/2023 | Lee et al. | |
| 2023/0097399 | A1 | 3/2023 | Abbas Mohamed Helmy et al. | |
| 2023/0163738 | A1 * | 5/2023 | Chen | H03F 3/04 330/278 |

* cited by examiner

【FIG. 1A】
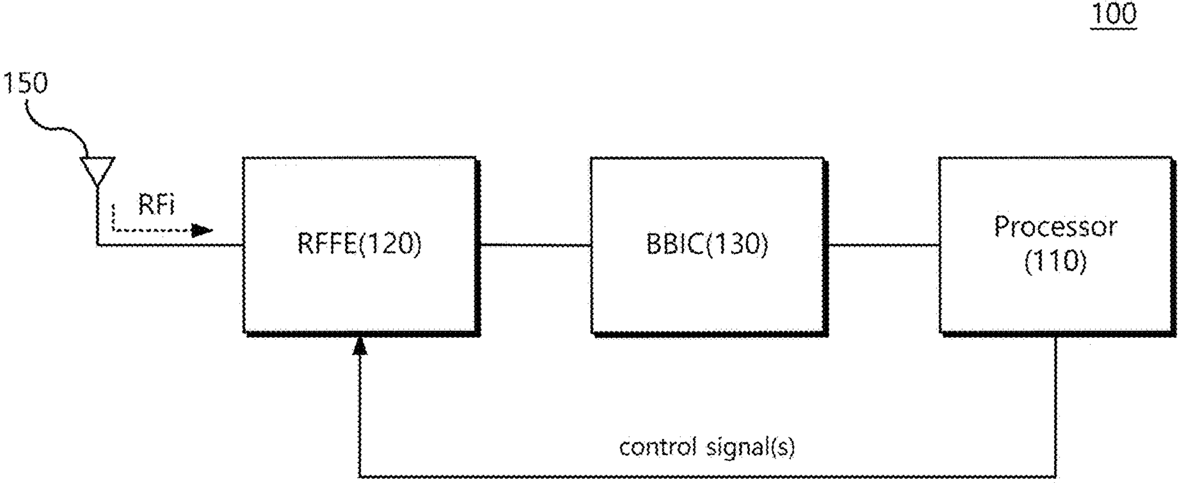

【FIG. 1B】
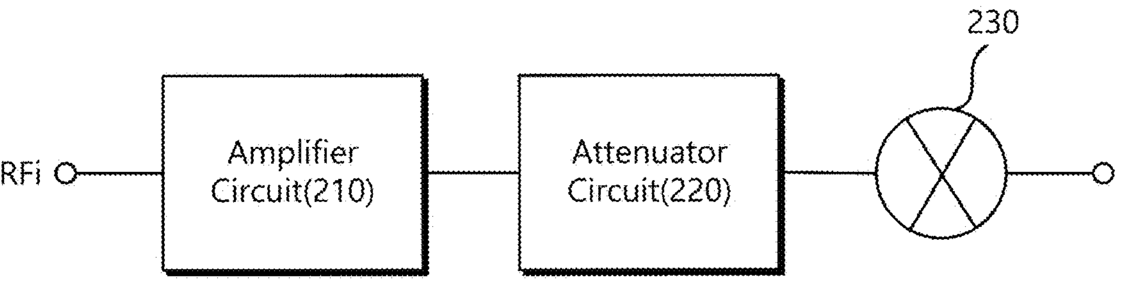

【FIG. 2A】
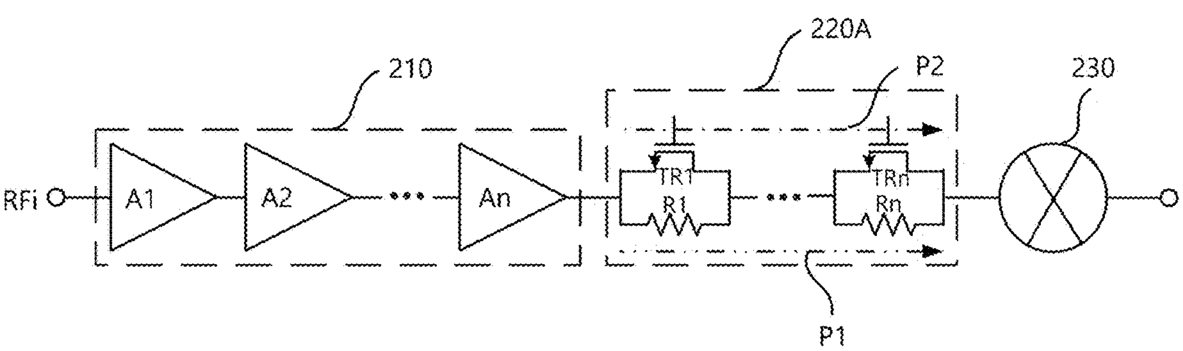

【FIG. 2B】

LUT

| Range | Attenuator Circuit Gain Loss(dB) | Amplifier Circuit Gain(dB) |
|---|---|---|
| G8 | 0 | 48 |
| G7 | 0 | 42 |
| G6 | 8 | 44 |
| G5 | 4 | 34 |
| G4 | 7 | 31 |
| G3 | 8 | 26 |
| G2 | 4 | 16 |
| G1 | 10 | 16 |
| G0 | 5 | 5 |

【FIG. 3】
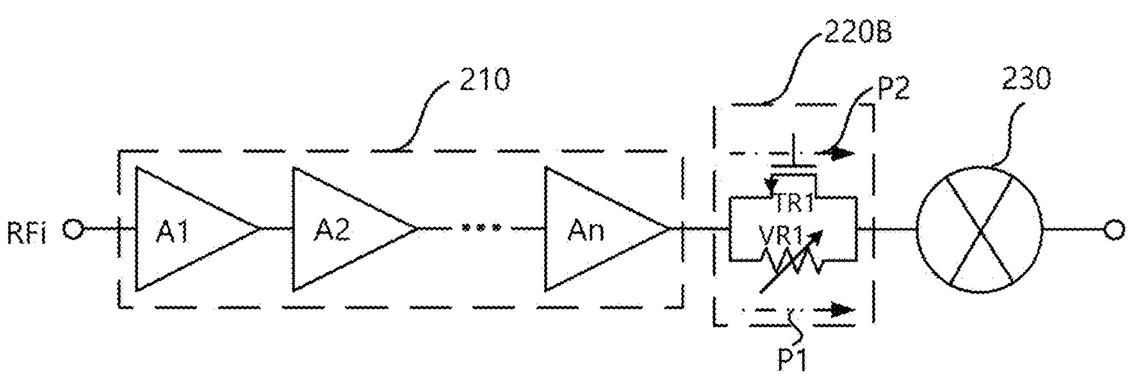

【FIG. 4】
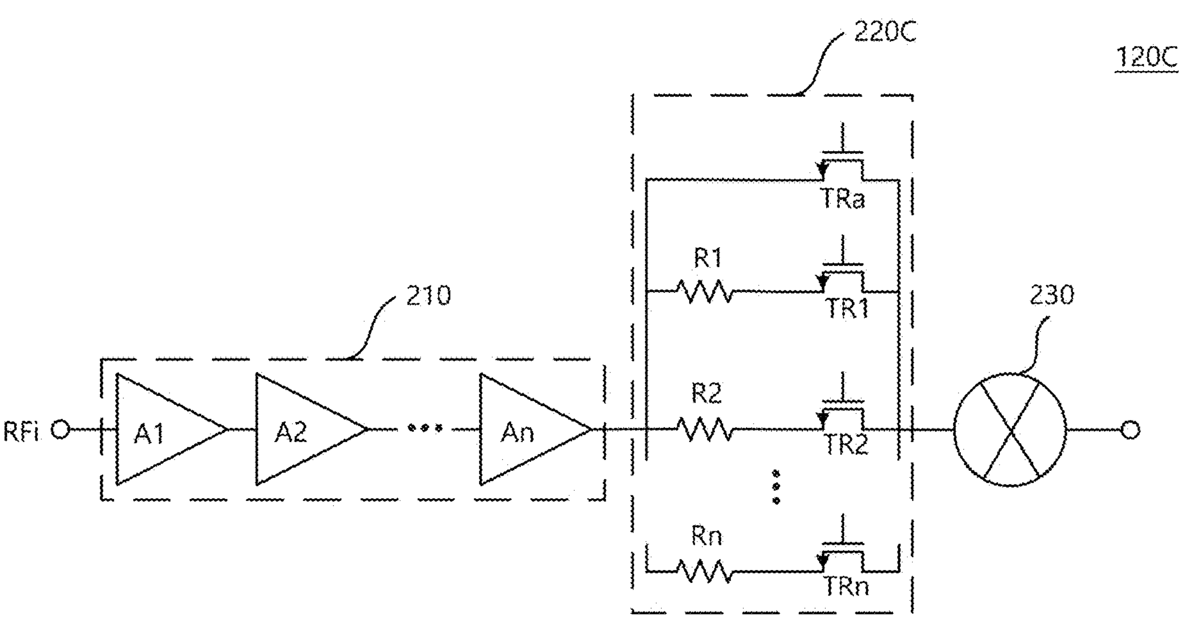

【FIG. 5】
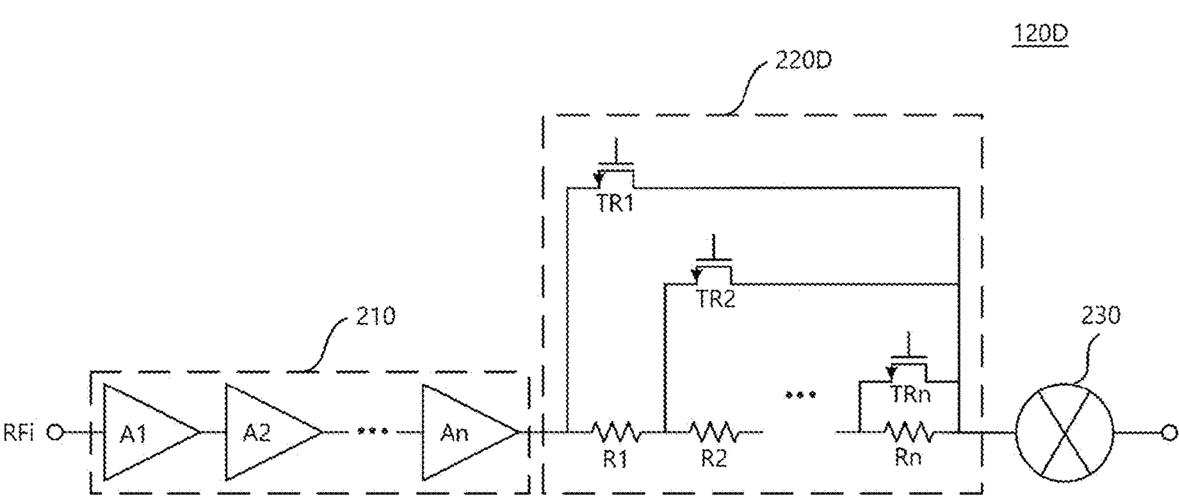

【FIG. 6】
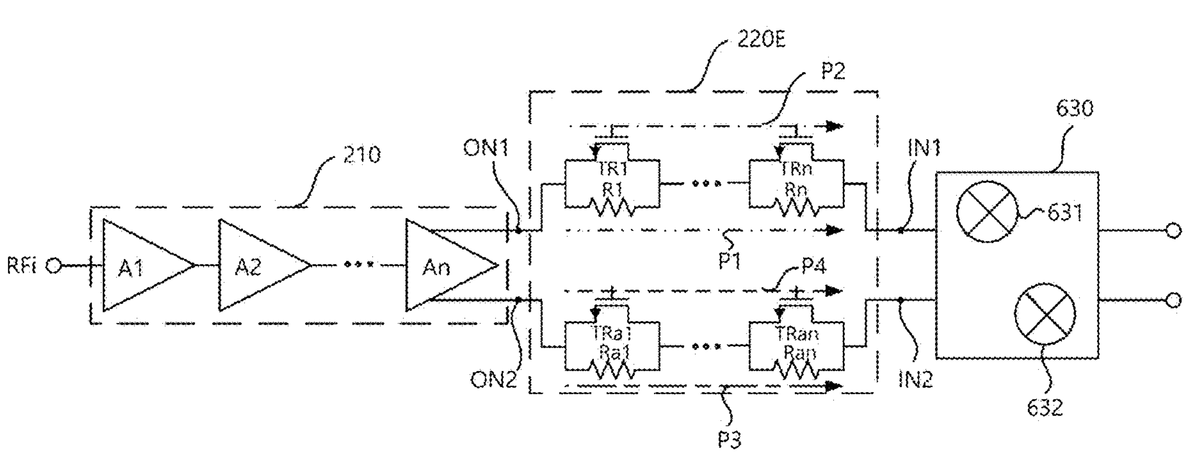

【FIG. 7A】
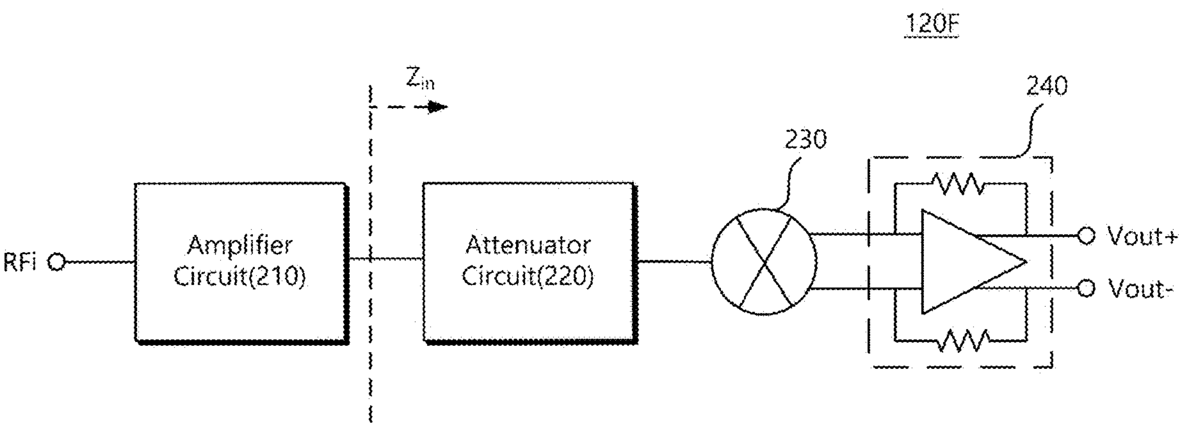

【FIG. 7B】
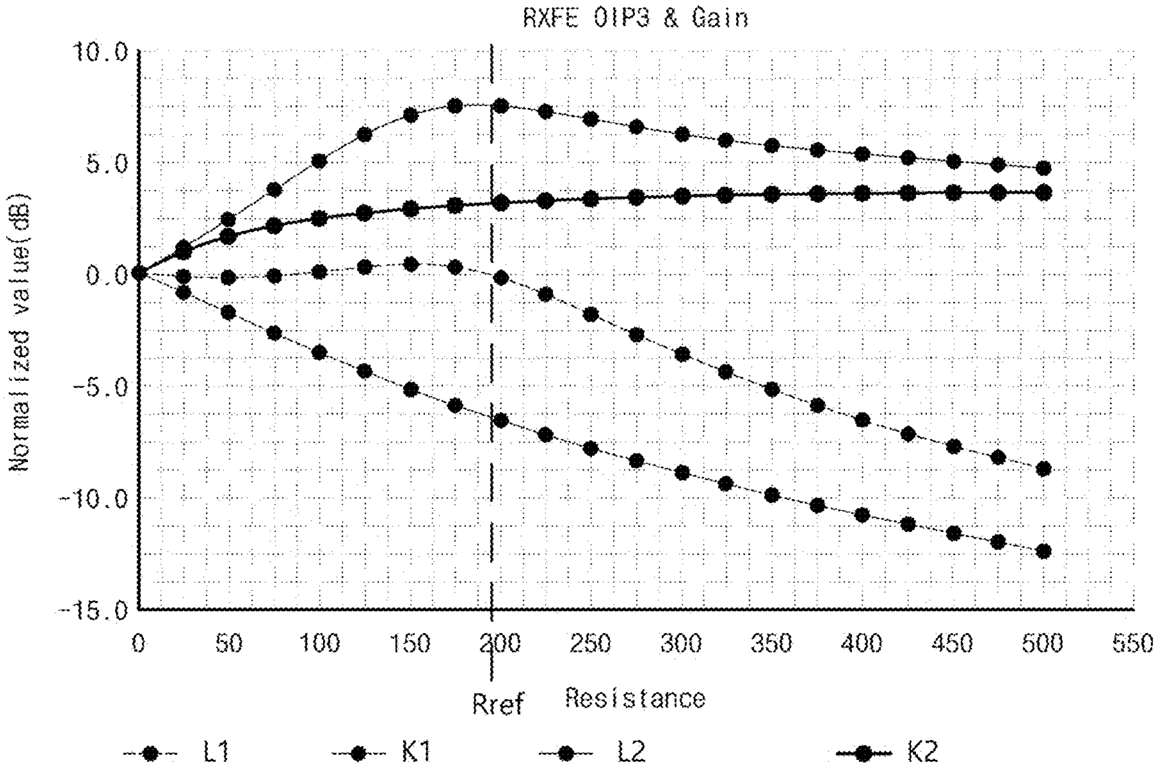

【FIG. 8】
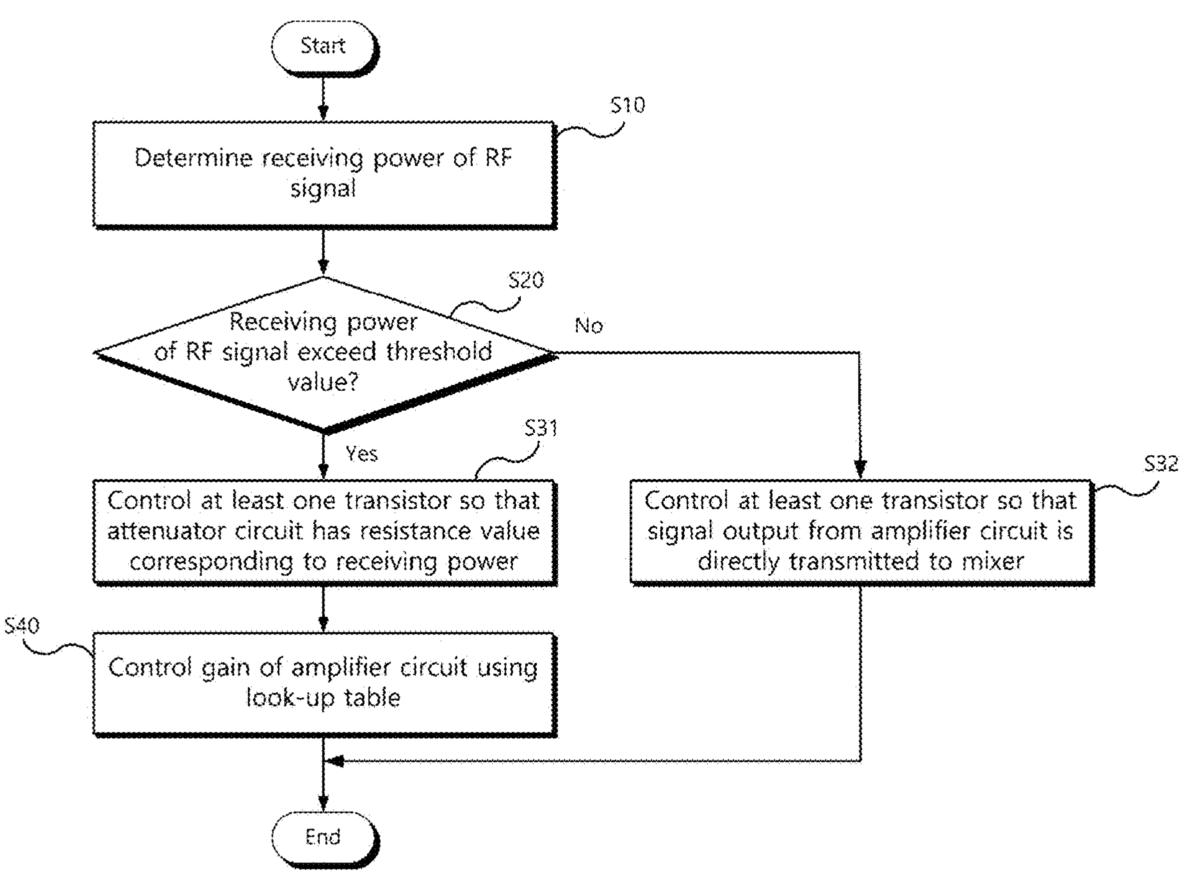

【FIG. 9】
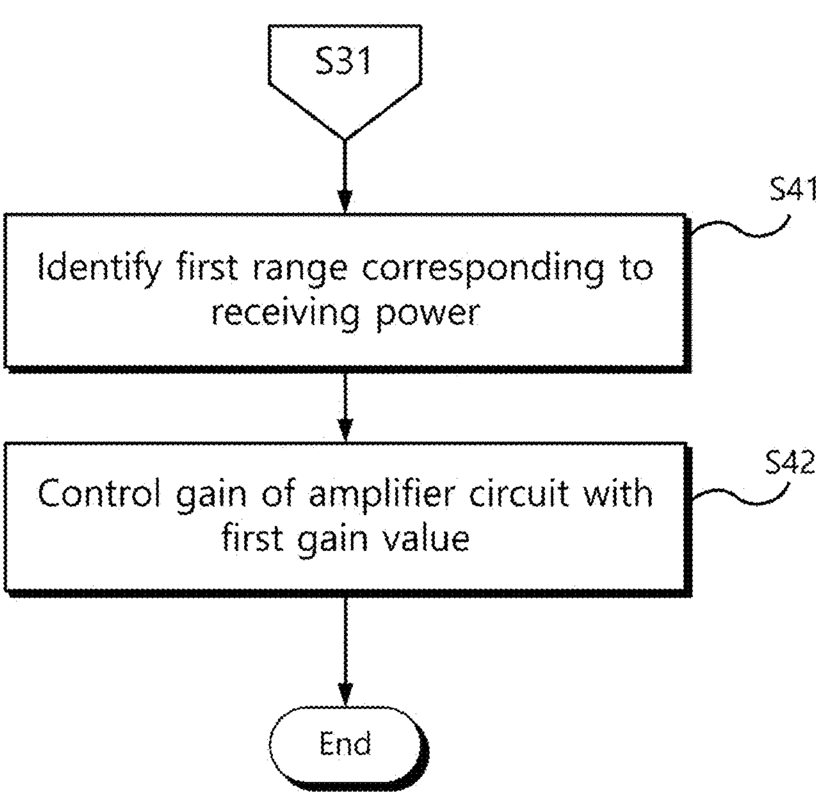

【FIG. 10】
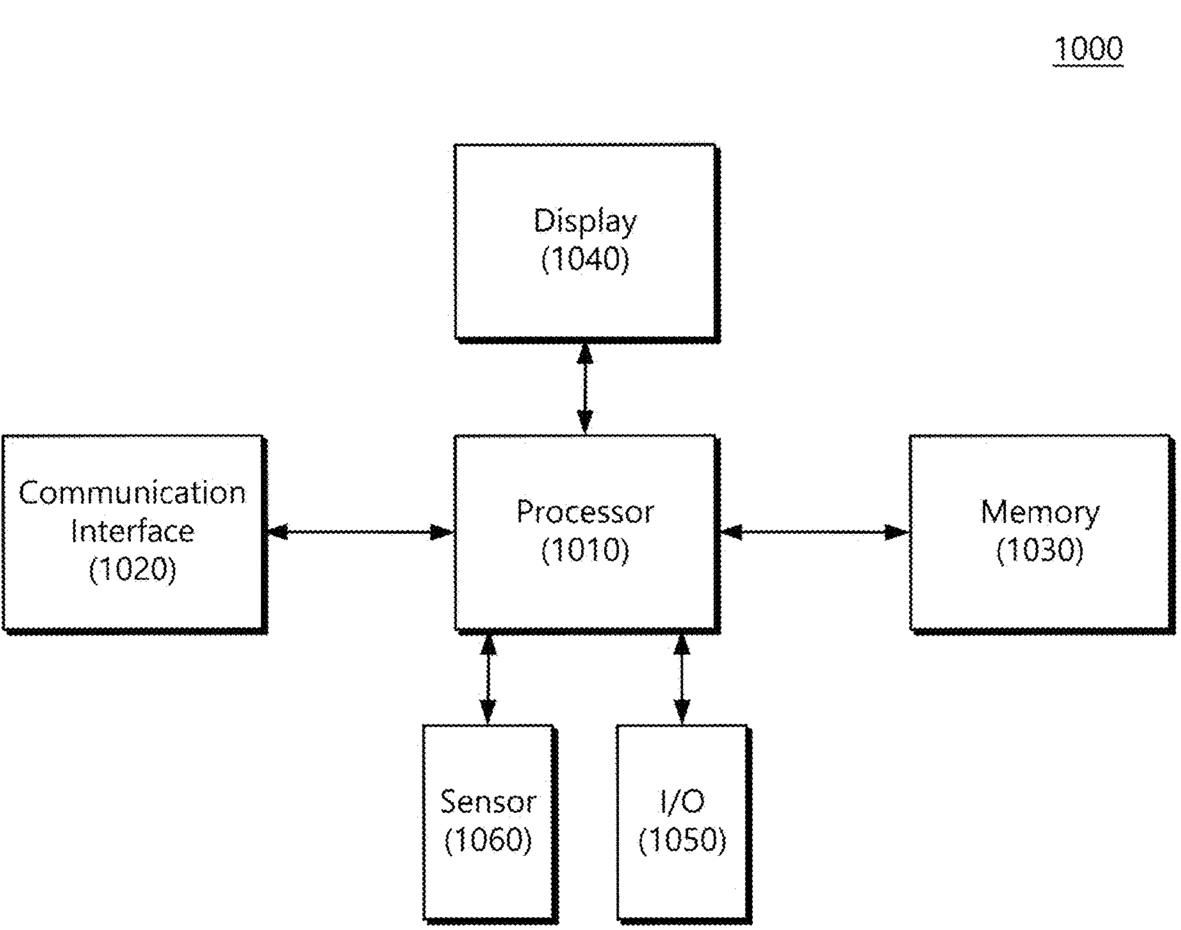

【FIG. 11】
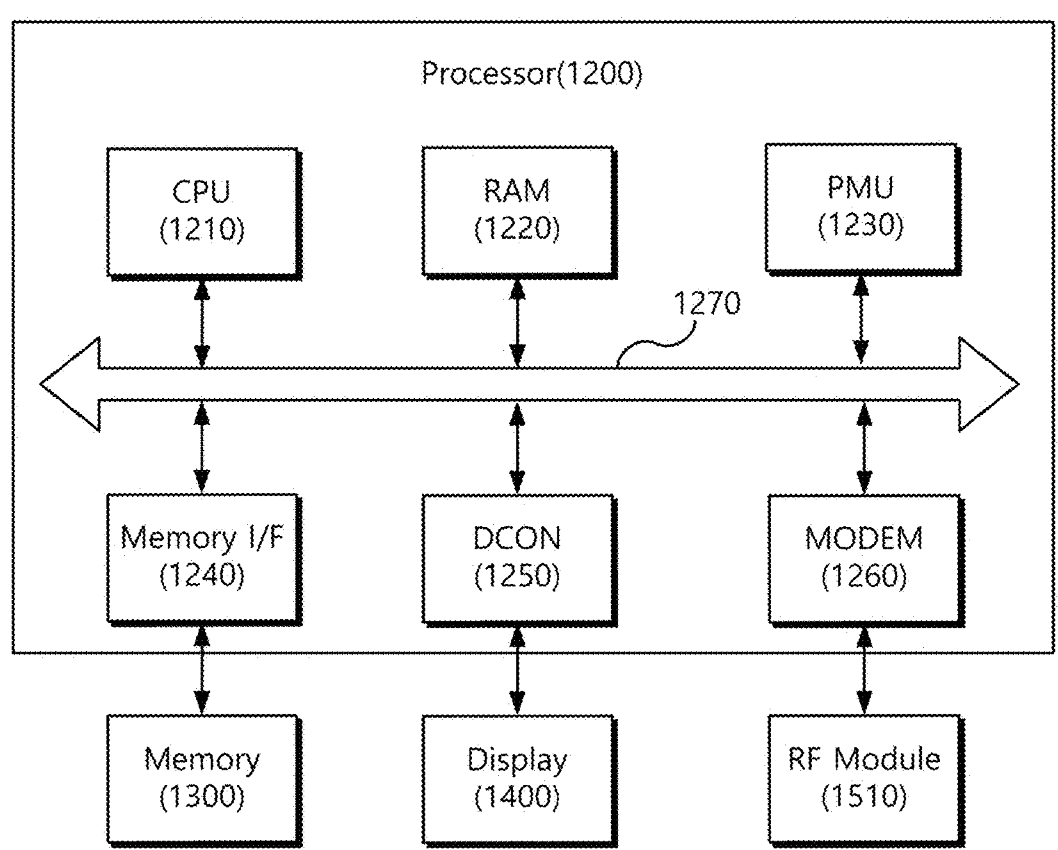

CIRCUIT FOR ATTENUATING SIGNAL RECEIVED THROUGH ANTENNA TO IMPROVE SNR, ELECTRONIC DEVICE INCLUDING THE SAME, AND METHOD FOR CONTROLLING THE SAME

CROSS-REFERENCE TO RELATED APPLICATIONS

This application claims priority under 35 U.S.C. § 119 to Korean Patent Application No. 10-2023-0110105, filed on Aug. 22, 2023, and Korean Patent Application No. 10-2024-0023435, filed on Feb. 19, 2024, in the Korean Intellectual Property Office, the disclosures of each of which are incorporated by reference herein in their entireties.

BACKGROUND

Embodiments of the present disclosure described herein relate to a circuit for attenuating a signal received through an antenna to improve a signal-to-noise ratio (SNR), an electronic device including the same, and a method for controlling the same.

As technology advances, the demand for communication systems to support high data rates is increasing. In particular, as the Wi-Fi standard develops, research is being conducted to improve the modulation scheme and the modulation accuracy to support higher data rates.

As part of this research, the signal-to-noise ratio (SNR) of radio frequency front ends (RFFE) among electronic devices should be improved. To improve the SNR, noise figures or linearity of the circuit should be improved.

However, there may be limits to increasing the level of the supply voltage in accordance with demands for miniaturization of electronic device processes and reduction of current consumption. In detail, there may be limits to improving the SNR of the RFFE by increasing the linearity of the RFFE through the supply voltage.

In addition, to improve the SNR by improving the noise figure of the RFFE, a gain of an amplifier included in the RFFE may be increased. However, when the noise figure of the RFFE are improved by increasing the gain of the amplifier, the linearity of the RFFE may decrease.

SUMMARY

Embodiments of the present disclosure provide an electronic device that improves the quality of signals received through an antenna using an attenuator circuit that operates according to the receiving power of signals received through the antenna.

According to embodiments of the present disclosure, an electronic device includes an amplifier circuit configured to amplify a radio frequency (RF) signal received from an antenna, the RF signal having a receiving power, an attenuator circuit connected between the amplifier circuit and a mixer, the attenuator circuit including at least one resistor and at least one transistor, and a processor electrically connected to the attenuator circuit and the amplifier circuit, the processor being configured to turn on a first transistor among the at least one transistor based on the receiving power being less than a threshold value, a signal output from the amplifier circuit being directly transferred to the mixer based on the first transistor being turned on, and control one or more transistors among the at least one transistor using a look-up table based on the receiving power being greater than or equal to the threshold value, the attenuator circuit having a first resistance value corresponding to the receiving power based on the control of the one or more transistors.

According to embodiments of the present disclosure, a method of controlling an RFFE (radio frequency front end) includes determining a first receiving power of a first RF signal received through an antenna, determining a second receiving power of a second RF signal received through the antenna, controlling at least one transistor included in an attenuator circuit such that a signal output from an amplifier circuit is directly transferred to a mixer in response to determining the first receiving power is less than a threshold value, the signal output from the amplifier circuit being the first RF signal amplified by the amplifier circuit, controlling the at least one transistor using a look-up table in response to determining the second receiving power is greater than or equal to the threshold value, the controlling causing the attenuator circuit to have a resistance value corresponding to the second receiving power, and controlling a gain of the amplifier circuit to have a gain value corresponding to the first receiving power using the look-up table.

According to embodiments of the present disclosure, an RFFE (radio frequency front end) includes an amplifier circuit configured to amplify an RF signal received through an antenna, an attenuator circuit including a plurality of resistors and a plurality of transistors, the plurality of resistors being connected between the amplifier circuit and a mixer, and each respective transistor among the plurality of transistors being connected in parallel with a corresponding resistor among the plurality of resistors, and a processor electrically connected to the attenuator circuit and the amplifier circuit, the processor being configured to turn off at least one among the plurality of transistors using a look-up table based on a receiving power of the RF signal being greater than or equal to a threshold value, the amplifier circuit and the mixer being connected through at least one among the plurality of resistors based on the at least one among the plurality of transistors being turned off, a combined resistance of the at least one among the plurality of resistors corresponding to the receiving power, and control a gain of the amplifier circuit to have a first gain value corresponding to the receiving power using the look-up table.

BRIEF DESCRIPTION OF THE FIGURES

The above and other objects and features of the present disclosure will become apparent by describing in detail embodiments thereof with reference to the accompanying drawings.

FIG. 1A is a block diagram of an electronic device, according to embodiments of the present disclosure.

FIG. 1B is a block diagram illustrating a configuration of an RFFE of FIG. 1A.

FIG. 2A is a circuit diagram illustrating an RFFE, according to embodiments.

FIG. 2B illustrates a look-up table including gain control amounts through an amplifier circuit and an attenuator circuit according to a receiving power of an RF signal, according to embodiments.

FIG. 3 is a circuit diagram illustrating an RFFE including a first variable resistor, according to embodiments.

FIG. 4 is a circuit diagram illustrating an RFFE including a plurality of resistors connected in parallel with each other and a plurality of transistors connected in series with each of the plurality of resistors, according to embodiments.

FIG. 5 is a circuit diagram illustrating an RFFE including a plurality of resistors connected in series with each other and a plurality of transistors each connected in parallel with at least one resistor, according to embodiments.

FIG. 6 is a circuit diagram illustrating an RFFE including an attenuator circuit connected between a plurality of output nodes of an amplifier circuit and a plurality of input nodes of a mixer, according to embodiments.

FIG. 7A is a circuit diagram illustrating an RFFE further including a transimpedance amplifier, according to embodiments.

FIG. 7B is a graph illustrating a gain and a linearity of each RFFE configuration as a processor controls a resistance of an attenuator circuit, according to embodiments.

FIG. 8 is a flowchart illustrating a method for controlling an RFFE of an electronic device, according to embodiments.

FIG. 9 is a flowchart illustrating a method for controlling a gain of an amplifier circuit, according to embodiments.

FIG. 10 is a block diagram illustrating an IoT device including an electronic device, according to embodiments.

FIG. 11 is a block diagram illustrating a mobile terminal to which an electronic device according to embodiments is applied.

DETAILED DESCRIPTION

Hereinafter, embodiments of the present disclosure may be described in detail and clearly to such an extent that an ordinary one in the art easily implements the present disclosure.

FIG. 1A is a block diagram of an electronic device, according to embodiments of the present disclosure. FIG. 1B is a block diagram illustrating a configuration of an RFFE of FIG. 1A.

Referring to FIG. 1, an electronic device 100 according to embodiments may include an antenna 150, a radio frequency front end (RFFE) 120, a base band integrated circuit (BBIC) 130, and/or a processor 110.

The electronic device 100 according to embodiments disclosed in the present disclosure may be of various types. The electronic device 100 may include, for example, a portable communication device (e.g., a smartphone), a computer device, a portable multimedia device, a portable medical device, a camera, and/or a wearable device. However, the electronic device 100 according to embodiments of the present disclosure is not limited to the above-described devices.

The electronic device 100 may include the antenna 150 that receives an RF signal including signals corresponding to a plurality of frequency bands. Accordingly, the electronic device 100 according to the present disclosure may be referred to as an antenna device including the antenna 150, a wireless communication device, or a wireless transceiver.

The electronic device 100 may include the RFFE 120 that receives a radio frequency (RF) signal RFi through the antenna 150.

The RFFE 120 according to embodiments may perform pre-processing (or processing) on a signal received through the antenna 150. The RFFE 120 may perform the pre-processing (or processing) on the RF signal RFi received through the antenna 150.

To this end, the RFFE 120 may include at least some of a phase shifter, a band pass filter, an amplifier, an attenuator, a mixer, and/or a switching circuit, which are connected to the antenna 150. According to embodiments, as used herein, reference to "at least some" elements may also refer to "at least one" element and may only refer to a single one of the elements.

Referring to FIG. 1B, the RFFE 120 according to embodiments may include an amplifier circuit 210, an attenuator circuit 220, and/or a mixer 230.

The RFFE 120 may include the amplifier circuit 210 that amplifies the RF signal RFi received through the antenna 150.

According to embodiments, the RFFE 120 may amplify the RF signal RFi by a gain of the amplifier circuit 210.

To this end, for example, the amplifier circuit 210 may include at least one low noise amplifier (LNA).

Additionally, the RFFE 120 may include the attenuator circuit 220 that attenuates the signal amplified through the amplifier circuit 210.

The attenuator circuit 220 according to embodiments may include at least one resistor. In detail, the signal output from the amplifier circuit 210 may be attenuated by the at least one resistor included in the attenuator circuit 220.

Additionally, the RFFE 120 may include the mixer 230 that receives a signal output from the attenuator circuit 220.

In more detail, the mixer 230 may convert the signal received from the attenuator circuit 220 into a signal having a specified frequency.

For example, the mixer 230 may down-convert the signal received from attenuator circuit 220 into a baseband signal having a specified frequency, based on a signal received from a local oscillator.

In more detail, the electronic device 100 may include the RFFE 120 that converts a baseband signal into an RF signal or an RF signal into a baseband signal. Additionally, the RFFE 120 may be connected to the BBIC 130. Accordingly, the RFFE 120 may pre-process (or process) the RF signal RFi received from the antenna 150 so as to be transmitted to the BBIC 130.

According to embodiments, when signals are received, the RFFE 120 may convert the RF signal RFi into a baseband signal to be processed by the processor 110. According to embodiments, processor 110 may receive the baseband signal converted by the RFFE 120, and may perform one or more further operation(s) based on the baseband signal. For example, the one or more further operation(s) may include one or more of providing the baseband signal to an application executing on the electronic device 100 (e.g., for performing a service based on data provided in the baseband signal), storing the baseband signal, generating and sending a response signal to the antenna 150 (e.g., via the BBIS 130 and RFFE 120) based on data provided in the baseband signal, etc.

For example, when signals are received, the RFFE 120 may convert a 2.4 GHz RF signal RFi, or a 5 GHz RF signal RFi, used in a first network (e.g., a Wi-Fi network) into a baseband signal.

In addition, as another example, when signals are received, the RFFE 120 may convert the RF signal RFi of about 700 MHz to about 3 GHz (e.g., having a frequency between about 700 MHz and about 3 GHz) used in a second network (e.g., a legacy network) into a baseband signal.

As still another example, when signals are received, the RFFE 120 may convert the RF signal RFi of about 6 GHz to about 60 GHz (e.g., having a frequency between about 6 GHz and about 60 GHz) used in a third network (e.g., a 5G network) into a baseband signal.

According to embodiments, for example, the RFFE 120 may convert the baseband signal generated by the processor 110 and the BBIC 130 into the RF signal RFi having a specified frequency during transmission operation.

According to embodiments, the electronic device 100 may include the BBIC 130 connected to the RFFE 120.

The electronic device 100 may include the processor 110 that is electrically connected to the RFFE 120 and the BBIC 130.

The processor 110, for example, may control at least one other component (e.g., the RFFE 120 or the BBIC 130) of the electronic device 100 by executing software (or a program), and may perform various data processing or calculations. The processor 110 may include a central processing unit or a microprocessor, and may control the overall operation of the electronic device 100. Accordingly, operations performed by the electronic device 100 (or the RFFE 120) may be understood as being performed under the control of the processor 110.

According to embodiments, the processor 110 may include an algorithm for controlling at least a portion of the RFFE 120 and/or the BBIC 130. For example, the algorithm may be software code programmed inside the processor 110. As another example, the algorithm may be hard coded inside the processor 110, but is not limited thereto.

The processor 110 may control a degree to which the RF signal RFi is attenuated through the attenuator circuit 220 according to the algorithm.

In more detail, referring to FIGS. 1A and 1B together, the processor 110 may control a resistance value of the attenuator circuit 220 based on the magnitude of a receiving power of the RF signal RFi.

The processor 110 may control the gain of the RF signal RFi attenuated through the attenuator circuit 220 based on the magnitude of the receiving power of the RF signal RFi.

For example, the processor 110 may control the resistance value of the attenuator circuit 220 such that the RF signal RFi is attenuated by the stored gain corresponding to the magnitude of the receiving power through the attenuator circuit 220, using a look-up table stored in advance.

Additionally, the processor 110 may control the gain of the amplifier circuit 210 based on the magnitude of the receiving power of the RF signal RFi.

In more detail, the processor 110 may allow the amplifier circuit 210 to have the stored gain corresponding to the magnitude of the receiving power of the RF signal RFi, using the look-up table.

For example, the processor 110 may use the look-up table to increase the gain of the amplifier circuit 210 to a stored gain value corresponding to the magnitude of the receiving power of the RF signal RFi. According to embodiments, the processor 110 may control the resistance value of the attenuator circuit 220 and/or the gain of the amplifier circuit 210 using one or more control signals output from the processor 110 to the attenuator circuit 220 and/or the amplifier circuit 210.

Through this, the processor 110 may maintain a path gain of the RFFE 120.

Additionally, the processor 110 may improve a noise figure of the RFFE 120 by increasing the gain of the amplifier circuit 210. In detail, the processor 110 may improve a signal-to-noise ratio (SNR) of the RFFE 120 by increasing the gain of the amplifier circuit 210.

Referring to the above-described configurations, the processor 110 according to embodiments may attenuate the gain of the RF signal RFi through the attenuator circuit 220 based on the magnitude of the receiving power of the RF signal RFi.

Additionally, the processor 110 may increase the gain of the amplifier circuit 210 based on the magnitude of the receiving power of the RF signal RFi.

Through this, the electronic device 100 according to embodiments of the present disclosure may reduce noise while maintaining the linearity of the RF signal RFi received through the antenna 150. In detail, the electronic device 100 may improve the quality of the RF signal RFi received through the antenna 150.

FIG. 2A is a circuit diagram illustrating an RFFE, according to embodiments. FIG. 2B illustrates a look-up table including gain control amounts through an amplifier circuit and an attenuator circuit according to a receiving power of an RF signal, according to embodiments.

Referring to FIG. 2A, an RFFE 120A according to embodiments may include the amplifier circuit 210, an attenuator circuit 220A, and/or the mixer 230.

In this case, the RFFE 120A of FIG. 2A may be understood as an example of the RFFE 120 illustrated in FIG. 1B. Accordingly, the same reference numerals (or similar reference numerals) are used for components that are the same as (or similar to) the above-described components, and additional descriptions that may overlap with the above-described content will be omitted to avoid redundancy.

According to embodiments, the amplifier circuit 210 may include a plurality of amplifiers A1 to An. In more detail, the amplifier circuit 210 may include the plurality of amplifiers A1 to An connected to each other in series.

In this case, for example, each of the plurality of amplifiers A1 to An may be understood as a low noise amplifier (LNA).

The amplifier circuit 210 according to embodiments may include the first amplifier A1 and the second amplifier A2 connected in series with each other.

However, the number and configuration of amplifiers included in the amplifier circuit 210 are not limited to the above-described examples.

According to embodiments, the attenuator circuit 220A may include a plurality of resistors R1 to Rn and a plurality of transistors TR1 to TRn.

In more detail, the attenuator circuit 220A may include the plurality of resistors R1 to Rn connected in series with each other.

For example, the attenuator circuit 220A may include the plurality of resistors R1 to Rn disposed on a first path P1 connected between the amplifier circuit 210 and the mixer 230.

Additionally, the attenuator circuit 220A may include the plurality of transistors TR1 to TRn connected in series with each other.

For example, the attenuator circuit 220A may include the plurality of transistors TR1 to TRn disposed on a second path P2 connected between the amplifier circuit 210 and the mixer 230.

In this case, each of the transistors TR1 to TRn may be connected in parallel with each of the resistors R1 to Rn, respectively. For example, the first transistor TR1 may be connected in parallel with the first resistor R1.

Referring to FIG. 2B, a look-up table LUT according to embodiments may include a range for the receiving power of the RF signal RFi, a gain loss through the attenuator circuit 220A corresponding to each range, and a gain of the amplifier circuit 210 corresponding to each range.

In this case, the look-up table LUT may be stored in the internal storage space of the electronic device 100 or the processor 110.

The look-up table LUT may include a plurality of ranges G0 to G8 for the receiving power of the RF signal RFi (also referred to herein as a plurality of receiving power ranges). According to embodiments, the plurality of ranges G0 to G8 may corresponding to ranges of successively lower receiving power, but embodiments are not limited thereto.

In this case, for example, each of the plurality of ranges G0 to G8 may be divided depending on the receiving power of the RF signal RFi. Additionally, for example, each of the plurality of ranges G0 to G8 may be divided depending on a size of the gain at which the RF signal RFi is amplified through the RFFE 120 (also referred to herein as amplifier gain values).

In addition, the look-up table LUT according to embodiments may include the gain loss through the attenuator circuit 220A corresponding to each of the plurality of ranges G0 to G8 (also referred to herein as gain losses).

In more detail, the look-up table LUT may include the degree to which the attenuator circuit 220A attenuates the gain of the RF signal RFi in correspondence with each of the plurality of ranges G0 to G8.

For example, when the receiving power of the RF signal RFi corresponds to the third range G2, the attenuator circuit 220A may be controlled to attenuate the RF signal RFi by 4 dB.

According to embodiments, the processor 110 may determine a resistance value corresponding to the receiving power based on the gain loss through the attenuator circuit 220A stored in the look-up table LUT.

In more detail, the processor 110 may determine the resistance value of the attenuator circuit 220A according to the receiving power, based on the gain loss stored corresponding to each of the plurality of ranges G0 to G8 in the look-up table LUT.

According to embodiments, the look-up table LUT may include information with respect to transistors to be turned off among the plurality of transistors TR1 to TRn included in the attenuator circuit 220A in correspondence with each of the plurality of ranges G0 to G8.

For example, the look-up table LUT may include the number of transistors to be turned off among the plurality of transistors TR1 to TRn included in the attenuator circuit 220A in correspondence with each of the plurality of ranges G0 to G8.

For example, when the receiving power of the RF signal RFi corresponds to the third range G2, at least some of the plurality of transistors TR1 to TRn may be turned off such that the attenuator circuit 220A attenuates the RF signal RFi by 4 dB.

Additionally, the look-up table LUT may include the gain of the amplifier circuit 210 corresponding to each of the plurality of ranges G0 to G8.

In more detail, the look-up table LUT may include the degree to which the gain of the amplifier circuit 210 is increased, in correspondence with each of the plurality of ranges G0 to G8.

For example, when the receiving power of the RF signal RFi corresponds to the third range G2, the amplifier circuit 210 may be controlled to amplify the RF signal RFi by 16 dB.

Referring to FIGS. 2A and 2B together, the processor 110 according to embodiments may control the attenuator circuit 220A and the amplifier circuit 210, based on the magnitude of the receiving power of the RF signal RFi, using the look-up table LUT stored in advance.

In more detail, the processor 110 may control the degree of gain attenuation through the attenuator circuit 220A and the gain of the amplifier circuit 210, based on the magnitude of the receiving power of the RF signal RFi, using the look-up table LUT stored in advance.

The processor 110 may use the look-up table LUT to control at least some of the plurality of transistors TR1 to TRn included in the attenuator circuit 220A depending on the magnitude of the receiving power of the RF signal RFi.

In detail, the processor 110 may control the resistance value of the attenuator circuit 220A through at least some of the plurality of transistors TR1 to TRn included in the attenuator circuit 220A depending on the magnitude of the receiving power of the RF signal RFi.

According to embodiments, the processor 110 may turn on the plurality of transistors TR1 to TRn when the receiving power of the RF signal RFi is less than a threshold value.

In more detail, when the receiving power of the RF signal RFi is less than the threshold value, the processor 110 may turn on the plurality of transistors TR1 to TRn such that a signal output from the amplifier circuit 210 is directly transferred to the mixer 230.

For example, when the receiving power of the RF signal RFi corresponds to the eighth period G7 or the ninth period G8, the processor 110 may turn on all of the plurality of transistors TR1 to TRn.

In detail, when the receiving power of the RF signal RFi is less than the threshold value, the processor 110 may turn on the plurality of transistors TR1 to TRn such that the RF signal RFi is transferred to the mixer 230 without being attenuated through the attenuator circuit 220A.

Referring to the above-described configurations, when the receiving power of the RF signal RFi is less than the threshold value, the processor 110 may turn on the plurality of transistors TR1 to TRn such that the RF signal RFi is not attenuated by the resistance of the attenuator circuit 220A (or the amount of attenuation is reduced).

Through this, the electronic device 100 according to embodiments of the present disclosure may minimize unnecessary gain degradation (or reduce gain degradation) caused by the attenuator circuit 220A when the RF signal RFi having lower power is received.

Additionally, when the RF signal RFi having lower power is received, the electronic device 100 may minimize (or reduce) power consumption to increase the gain of the amplifier circuit 210.

In addition, according to embodiments, when the receiving power of the RF signal RFi is greater than or equal to the threshold value, the processor 110 may control at least some of the plurality of transistors TR1 to TRn using the look-up table LUT.

In more detail, when the receiving power of the RF signal RFi is greater than or equal to the threshold value, the processor 110 may control at least some of the plurality of transistors TR1 to TRn such that the attenuator circuit 220A has a resistance value corresponding to the receiving power of the RF signal RFi, using the look-up table LUT.

When the receiving power of the RF signal RFi is greater than or equal to the threshold value, the processor 110 may turn off at least some of the plurality of transistors TR1 to TRn using the look-up table LUT such that the attenuator circuit 220A has a gain loss stored in correspondence with the range to which the receiving power of the RF signal RFi corresponds.

For example, when the receiving power of the RF signal RFi belongs to the fifth range G4, the processor 110 may turn off at least some of the plurality of transistors TR1 to TRn such that the RF signal RFi is attenuated by 7 dB through the attenuator circuit 220A.

For example, when the receiving power of the RF signal RFi belongs to the first range G0, the processor 110 may turn off at least some of the plurality of transistors TR1 to TRn such that the RF signal RFi is attenuated by 5 dB through the attenuator circuit 220A.

In this case, when at least some of the plurality of transistors TR1 to TRn are turned off, the amplifier circuit 210 may be connected to the mixer 230 through resistors connected in parallel with the turned-off transistors.

In addition, the signal amplified through the amplifier circuit 210 may be attenuated by a loss in a path gain according to the combined resistance of resistors connected in parallel with the turned-off transistors.

In this case, the resistance value of the combined resistance of the resistors connected between the amplifier circuit 210 and the mixer 230, and the loss in the path gain according to the resistance value, may be determined according to the magnitude of the receiving power of the RF signal RFi.

In detail, the processor 110 may control the resistance value of the attenuator circuit 220A through at least some of the plurality of transistors TR1 to TRn such that the RF signal RFi is attenuated through the attenuator circuit 220A by the gain loss stored in correspondence with the range to which the receiving power of the RF signal RFi corresponds.

Furthermore, the processor 110 may control the gain of the amplifier circuit 210 using the look-up table LUT.

In more detail, the processor 110 may control the gain of at least some of the plurality of amplifiers A1 to An included in the amplifier circuit 210 using the look-up table LUT.

According to embodiments, the processor 110 may control the gain of the amplifier circuit 210 to a gain value stored in correspondence with the range to which the receiving power of the RF signal RFi belongs, in the look-up table LUT.

The processor 110 may use the look-up table LUT to increase the gain of the amplifier circuit 210 to a gain value stored in correspondence with the range to which the receiving power of the RF signal RFi belongs.

For example, when the receiving power of the RF signal RFi belongs to the fifth range G4, the processor 110 may control the gain of the amplifier circuit 210 to 31 dB.

For example, when the receiving power of the RF signal RFi belongs to the third range G2, the processor 110 may control the gain of the amplifier circuit 210 to 16 dB.

Referring to the above-described configurations, the processor 110 according to embodiments may control the resistance value of the attenuator circuit 220A depending on the receiving power of the RF signal RFi received through the antenna 150, using the look-up table LUT.

In detail, the processor 110 may control a size of a gain at which the RF signal RFi is attenuated by the attenuator circuit 220A depending on the receiving power of the RF signal RFi received through the antenna 150, using the look-up table LUT.

Furthermore, the processor 110 may use the look-up table LUT to increase the gain of the amplifier circuit 210 to a gain value stored in correspondence with the range to which the receiving power of the RF signal RFi belongs.

Therefore, the electronic device 100 according to embodiments of the present disclosure may improve the noise figure of the RF signal RFi by increasing the gain of the amplifier circuit 210 while attenuating the gain of the RF signal RFi through the attenuator circuit 220A.

Additionally, the electronic device 100 may improve the signal quality (e.g., SNR) of the RF signal RFi received through the antenna 150 by increasing the gain of the amplifier circuit 210.

FIG. 3 is a circuit diagram illustrating an RFFE including a first variable resistor, according to embodiments.

Referring to FIG. 3, an RFFE 120B according to embodiments may include the amplifier circuit 210, an attenuator circuit 220B, and/or the mixer 230.

In this case, the RFFE 120B of FIG. 3 may be understood as an example of the RFFE 120 illustrated in FIG. 1B. Accordingly, the same reference numerals (or similar reference numerals) are used for components that are the same as (or similar to) the above-described components, and additional descriptions that may overlap with the above-described content will be omitted to avoid redundancy.

According to embodiments, the amplifier circuit 210 may include the plurality of amplifiers A1 to An. In more detail, the amplifier circuit 210 may include the plurality of amplifiers A1 to An connected to each other in series.

Additionally, the attenuator circuit 220B according to embodiments may include a first variable resistor VR1 and the first transistor TR1.

In more detail, the attenuator circuit 220B may include the first variable resistor VR1 connected between the amplifier circuit 210 and the mixer 230.

For example, the attenuator circuit 220B may include the first variable resistor VR1 disposed on the first path P1 connected between the amplifier circuit 210 and the mixer 230.

Additionally, the attenuator circuit 220B may include the first transistor TR1 connected in parallel with the first variable resistor VR1. According to embodiments, the attenuator circuit 220B may include the first transistor TR1 as the only transistor in the attenuator circuit 220B.

For example, the attenuator circuit 220B may include the first transistor TR1 disposed on the second path P2 connected in parallel with the first path P1 between the amplifier circuit 210 and the mixer 230.

The processor 110 according to embodiments may control the attenuator circuit 220B and the amplifier circuit 210 depending on the receiving power of the RF signal RFi, using the look-up table LUT stored in advance.

In more detail, the processor 110 may control the resistance value of the attenuator circuit 220B and the gain of the amplifier circuit 210 depending on the receiving power of the RF signal RFi, using the look-up table LUT.

For example, the processor 110 may control the resistance value of the first variable resistor VR1 and the gain of the amplifier circuit 210 depending on the receiving power of the RF signal RFi, using the look-up table LUT.

According to embodiments, the processor 110 may turn on the first transistor TR1 when the receiving power of the RF signal RFi is less than the threshold value.

In more detail, when the receiving power of the RF signal RFi is less than the threshold value, the processor 110 may turn on the first transistor TR1 such that a signal output from the amplifier circuit 210 is directly transferred to the mixer 230.

When the receiving power of the RF signal RFi is less than the threshold value, the processor 110 may turn on the first transistor TR1 such that the amplifier circuit 210 is directly connected to the mixer 230.

Referring to the above-described configurations, when the receiving power of the RF signal RFi is less than the threshold value, the processor 110 may turn on the first transistor TR1 such that the RF signal RFi is not attenuated by the first variable resistor VR1.

Through this, the electronic device 100 according to embodiments of the present disclosure may minimize unnecessary gain degradation (or reduce gain degradation) caused by the attenuator circuit 220B when the RF signal RFi having lower power is received.

Additionally, when the RF signal RFi having lower power is received, the electronic device 100 may minimize (or reduce) power consumption to increase the gain of the amplifier circuit 210.

According to embodiments, when the receiving power of the RF signal RFi is greater than or equal to a threshold value, the processor 110 may control the resistance value of the first variable resistor VR1 using the look-up table LUT.

In more detail, when the receiving power of the RF signal RFi is greater than the threshold value, the processor 110 may control the resistance value of the first variable resistor VR1 using the look-up table LUT such that the attenuator circuit 220B has the gain loss corresponding to the range to which the receiving power of the RF signal RFi belongs.

In detail, the processor 110 may control the resistance value of the first variable resistor VR1 such that the RF signal RFi is attenuated by the gain loss corresponding to the range to which the receiving power of the RF signal RFi belongs through the first variable resistor VR1.

For example, when the receiving power of the RF signal RFi belongs to the fifth range G4, the processor 110 may control the resistance value of the first variable resistor VR1 such that the RF signal RFi is attenuated by 7 dB through the attenuator circuit 220B (or the first variable resistor VR1). According to embodiments, the resistance value of the attenuator circuit 220B may be the same as, similar to, or correspond to the resistance value of the first variable resistor VR1.

In addition, when the receiving power of the RF signal RFi is greater than or equal to the threshold value, the processor 110 may turn off the first transistor TR1.

Furthermore, the processor 110 may control the gain of the amplifier circuit 210 using the look-up table LUT.

According to embodiments, the processor 110 may control the gain of the amplifier circuit 210 to a gain value stored in the look-up table LUT in correspondence with the range to which the receiving power of the RF signal RFi belongs.

The processor 110 may use the look-up table LUT to increase the gain of the amplifier circuit 210 to a gain value stored in correspondence with the range to which the receiving power of the RF signal RFi belongs.

For example, when the receiving power of the RF signal RFi belongs to the fifth range G4, the processor 110 may control the gain of the amplifier circuit 210 to 31 dB.

Referring to the above-described configurations, the processor 110 according to embodiments may control the resistance value of the attenuator circuit 220B depending on the receiving power of the RF signal RFi received through the antenna 150, using the look-up table LUT.

In detail, the processor 110 may control a size of a gain at which the RF signal RFi is attenuated by the attenuator circuit 220B depending on the receiving power of the RF signal RFi received through the antenna 150, using the look-up table LUT.

Furthermore, the processor 110 may use the look-up table LUT to increase the gain of the amplifier circuit 210 to a gain value stored in correspondence with the range to which the receiving power of the RF signal RFi belongs.

Therefore, the electronic device 100 according to embodiments of the present disclosure may improve the linearity of the RF signal RFi by increasing the gain of the amplifier circuit 210 while attenuating the gain of the RF signal RFi through the attenuator circuit 220B.

In addition, the electronic device 100 may improve the signal quality (e.g., SNR) of the RF signal RFi received through the antenna 150 by increasing the gain of the amplifier circuit 210.

FIG. 4 is a circuit diagram illustrating an RFFE including a plurality of resistors connected in parallel with each other and a plurality of transistors connected in series with each of the plurality of resistors, according to embodiments.

Referring to FIG. 4, an RFFE 120C according to embodiments may include the amplifier circuit 210, an attenuator circuit 220C, and/or the mixer 230.

In this case, the RFFE 120C of FIG. 4 may be understood as an example of the RFFE 120 illustrated in FIG. 1B. Accordingly, the same reference numerals (or similar reference numerals) are used for components that are the same as (or similar to) the above-described components, and additional descriptions that may overlap with the above-described content will be omitted to avoid redundancy.

According to embodiments, the amplifier circuit 210 may include the plurality of amplifiers A1 to An. In more detail, the amplifier circuit 210 may include the plurality of amplifiers A1 to An connected to each other in series.

In addition, the attenuator circuit 220C according to embodiments may include the plurality of resistors R1 to Rn, and the plurality of transistors TR1 to TRn, connected in parallel with each other.

In more detail, the attenuator circuit 220C may include the plurality of resistors R1 to Rn connected in parallel between the amplifier circuit 210 and the mixer 230.

In addition, the attenuator circuit 220C may include the plurality of transistors TR1 to TRn each connected in series with the plurality of resistors R1 to Rn.

Additionally, the attenuator circuit 220C may include a bypass transistor TRa connected in parallel with the plurality of resistors R1 to Rn and the plurality of transistors TR1 to TRn.

The processor 110 according to embodiments may control the attenuator circuit 220C and the amplifier circuit 210 depending on the receiving power of the RF signal RFi, using the look-up table LUT stored in advance.

In more detail, the processor 110 may control the resistance value of the attenuator circuit 220C and the gain of the amplifier circuit 210 using the look-up table LUT, depending on the receiving power of the RF signal RFi.

According to embodiments, the processor 110 may turn on the bypass transistor TRa when the receiving power of the RF signal RFi is less than the threshold value.

In more detail, when the receiving power of the RF signal RFi is less than the threshold value, the processor 110 may turn on the bypass transistor TRa such that the signal output from the amplifier circuit 210 is directly transferred to the mixer 230 through a path including the bypass transistor TRa.

When the receiving power of the RF signal RFi is less than the threshold value, the processor 110 may turn on the bypass transistor TRa such that the amplifier circuit 210 is directly connected to the mixer 230 through the path including the bypass transistor TRa.

In this case, the processor 110 may turn off the plurality of transistors TR1 to TRn.

Referring to the above-described configurations, when the receiving power of the RF signal RFi is less than the threshold value, the processor 110 may turn on the bypass transistor TRa such that the RF signal RFi is not attenuated by the attenuator circuit 220C (or the amount of attenuation is reduced).

Through this, the electronic device 100 according to embodiments of the present disclosure may minimize unnecessary gain degradation (or reduce gain degradation) caused by the attenuator circuit 220C when the RF signal RFi having lower power is received.

Additionally, when the RF signal RFi having lower power is received, the electronic device 100 may minimize (or reduce) power consumption to increase the gain of the amplifier circuit 210.

According to embodiments, when the receiving power of the RF signal RFi is greater than or equal to the threshold value, the processor 110 may control at least some of the plurality of transistors TR1 to TRn using the look-up table LUT.

In more detail, when the receiving power of the RF signal RFi is greater than or equal to the threshold value, the processor 110 may control at least some of the plurality of transistors TR1 to TRn using the look-up table LUT such that the attenuator circuit 220C has the gain loss stored in correspondence with the range to which the receiving power of the RF signal RFi belongs.

In detail, the processor 110 may control at least some of the plurality of transistors TR1 to TRn such that the RF signal RFi is attenuated by the gain loss stored in correspondence with the range to which the receiving power of the RF signal RFi belongs through at least some of the plurality of resistors R1 to Rn.

For example, when the receiving power of the RF signal RFi belongs to the fifth range G4, the processor 110 may turn on at least some of the plurality of transistors TR1 to TRn such that the RF signal RFi is attenuated by 7 dB through the attenuator circuit 220C.

Additionally, when the receiving power of the RF signal RFi is greater than or equal to the threshold value, the processor 110 may turn off the bypass transistor TRa.

In detail, the processor 110 may control the resistance value of the attenuator circuit 220C through at least some of the plurality of transistors TR1 to TRn such that the RF signal RFi is attenuated through the attenuator circuit 220C by the gain loss stored in correspondence with the range to which the receiving power of the RF signal RFi corresponds.

Furthermore, the processor 110 may control the gain of the amplifier circuit 210 using the look-up table LUT.

According to embodiments, the processor 110 may control the gain of the amplifier circuit 210 to a gain value stored in the look-up table LUT in correspondence with the range to which the receiving power of the RF signal RFi belongs.

The processor 110 may use the look-up table LUT to increase the gain of the amplifier circuit 210 to a gain value stored in correspondence with the range to which the receiving power of the RF signal RFi belongs.

For example, when the receiving power of the RF signal RFi belongs to the fifth range G4, the processor 110 may control the gain of the amplifier circuit 210 to 31 dB.

Referring to the above-described configurations, the processor 110 according to embodiments may control the resistance value of the attenuator circuit 220C depending on the receiving power of the RF signal RFi received through the antenna 150, using the look-up table LUT.

In detail, the processor 110 may control a size of a gain at which the RF signal RFi is attenuated by the attenuator circuit 220C depending on the receiving power of the RF signal RFi received through the antenna 150, using the look-up table LUT.

Furthermore, the processor 110 may use the look-up table LUT to increase the gain of the amplifier circuit 210 to a gain value stored in correspondence with the range to which the receiving power of the RF signal RFi belongs.

Therefore, the electronic device 100 according to embodiments of the present disclosure may improve the linearity of the RF signal RFi by increasing the gain of the amplifier circuit 210 while attenuating the gain of the RF signal RFi through the attenuator circuit 220C.

Additionally, the electronic device 100 may improve the signal quality (e.g., SNR) of the RF signal RFi received through the antenna 150 by increasing the gain of the amplifier circuit 210.

FIG. 5 is a circuit diagram illustrating an RFFE including a plurality of resistors connected in series with each other and a plurality of transistors each connected in parallel with at least one resistor, according to embodiments.

Referring to FIG. 5, an RFFE 120D according to embodiments may include the amplifier circuit 210, an attenuator circuit 220D, and/or the mixer 230.

In this case, the RFFE 120D of FIG. 5 may be understood as an example of the RFFE 120 illustrated in FIG. 1B. Accordingly, the same reference numerals (or similar reference numerals) are used for components that are the same as (or similar to) the above-described components, and additional descriptions that may overlap with the above-described content will be omitted to avoid redundancy.

According to embodiments, the amplifier circuit 210 may include the plurality of amplifiers A1 to An. In more detail, the amplifier circuit 210 may include the plurality of amplifiers A1 to An connected to each other in series.

In addition, the attenuator circuit 220D according to embodiments may include the plurality of resistors R1 to Rn and the plurality of transistors TR1 to TRn.

In more detail, the attenuator circuit 220D may include the plurality of resistors R1 to Rn connected in series between the amplifier circuit 210 and the mixer 230.

In addition, the attenuator circuit 220D may include the plurality of transistors TR1 to TRn each connected in parallel with at least some of the plurality of resistors R1 to Rn.

For example, the attenuator circuit 220D may include the first transistor TR1 connected in parallel with the first resistor R1 to the n-th resistor Rn. Additionally, the attenuator circuit 220D may include the second transistor TR2 connected in parallel with the second resistor R2 to the n-th resistor Rn. Additionally, the attenuator circuit 220D may include the n-th transistor TRn connected in parallel with the n-th resistor Rn.

The processor 110 according to embodiments may control the attenuator circuit 220D and the amplifier circuit 210 depending on the receiving power of the RF signal RFi, using the look-up table LUT stored in advance.

In more detail, the processor 110 may control the resistance value of the attenuator circuit 220D and the gain of the amplifier circuit 210 using the look-up table LUT, depending on the receiving power of the RF signal RFi.

According to embodiments, the processor 110 may turn on the first transistor TR1 when the receiving power of the RF signal RFi is less than the threshold value.

In more detail, when the receiving power of the RF signal RFi is less than the threshold value, the processor 110 may turn on the first transistor TR1 such that the signal output from the amplifier circuit 210 is directly transferred to the mixer 230 through a path including the first transistor TR1.

When the receiving power of the RF signal RFi is less than the threshold value, the processor 110 may turn on the first transistor TR1 such that the amplifier circuit 210 is directly connected to the mixer 230 through the path including the first transistor TR1.

Additionally, when the receiving power of the RF signal RFi is less than the threshold value, the processor 110 may turn off the second transistor TR2 to the n-th transistor TRn.

Referring to the above-described configurations, when the receiving power of the RF signal RFi is less than the threshold value, the processor 110 may turn on the first transistor TR1 such that the RF signal RFi is not attenuated by the attenuator circuit 220D (or the amount of attenuation is reduced).

Through this, the electronic device 100 according to embodiments of the present disclosure may minimize unnecessary gain degradation (or reduce gain degradation) caused by the attenuator circuit 220D when the RF signal RFi having lower power is received.

Additionally, when the RF signal RFi having lower power is received, the electronic device 100 may minimize (or reduce) power consumption to increase the gain of the amplifier circuit 210.

According to embodiments, when the receiving power of the RF signal RFi is greater than or equal to the threshold value, the processor 110 may control at least some of the plurality of transistors TR1 to TRn using the look-up table LUT.

In more detail, when the receiving power of the RF signal RFi is greater than or equal to the threshold value, the processor 110 may control at least some of the plurality of transistors TR1 to TRn using the look-up table LUT such that the attenuator circuit 220D has the gain loss stored in correspondence with the range to which the receiving power of the RF signal RFi belongs.

In detail, the processor 110 may turn on at least some of the plurality of transistors TR1 to TRn such that the RF signal RFi is attenuated by the gain loss stored in correspondence with the range to which the receiving power of the RF signal RFi belongs through at least some of the plurality of resistors R1 to Rn.

For example, when the receiving power of the RF signal RFi belongs to the fifth range G4, the processor 110 may turn off at least some of the plurality of transistors TR1 to TRn such that the RF signal RFi is attenuated by 7 dB through the attenuator circuit 220D.

In detail, when the receiving power of the RF signal RFi belongs to the fifth range G4, the processor 110 may turn off at least some of the plurality of transistors TR1 to TRn such that the RF signal RFi is attenuated by 7 dB through at least some of the plurality of resistors R1 to Rn.

In addition, when the receiving power of the RF signal RFi is greater than or equal to the threshold value, the processor 110 may turn off the first transistor TR1.

Furthermore, the processor 110 may control the gain of the amplifier circuit 210 using the look-up table LUT.

According to embodiments, the processor 110 may control the gain of the amplifier circuit 210 to a gain value stored in the look-up table LUT in correspondence with the range to which the receiving power of the RF signal RFi belongs.

The processor 110 may use the look-up table LUT to increase the gain of the amplifier circuit 210 to a gain value stored in correspondence with the range to which the receiving power of the RF signal RFi belongs.

For example, when the receiving power of the RF signal RFi belongs to the fifth range G4, the processor 110 may control the gain of the amplifier circuit 210 to 31 dB.

Referring to the above-described configurations, the processor 110 according to embodiments may control the resistance value of the attenuator circuit 220D depending on a size of the receiving power of the RF signal RFi received through the antenna 150, using the look-up table LUT.

In detail, the processor 110 may control a size of a gain at which the RF signal RFi is attenuated by the attenuator circuit 220D depending on the size of the receiving power of the RF signal RFi received through the antenna 150, using the look-up table LUT.

Furthermore, the processor 110 may use the look-up table LUT to increase the gain of the amplifier circuit 210 to a gain value stored in correspondence with the range to which the receiving power of the RF signal RFi belongs.

Therefore, the electronic device 100 according to embodiments of the present disclosure may improve the linearity of the RF signal RFi by increasing the gain of the amplifier circuit 210 while attenuating the gain of the RF signal RFi through the attenuator circuit 220D.

Additionally, the electronic device 100 may improve the signal quality (e.g., SNR) of the RF signal RFi received through the antenna 150 by increasing the gain of the amplifier circuit 210.

FIG. 6 is a circuit diagram illustrating an RFFE including an attenuator circuit connected between a plurality of output nodes of an amplifier circuit and a plurality of input nodes of a mixer, according to embodiments.

Referring to FIG. 6, an RFFE 120E according to embodiments may include the amplifier circuit 210, an attenuator circuit 220E, and/or a mixer 630.

In this case, the RFFE 120E of FIG. 6 may be understood as an example of the RFFE 120 illustrated in FIG. 1B. Accordingly, the same reference numerals (or similar reference numerals) are used for components that are the same as (or similar to) the above-described components, and additional descriptions that may overlap with the above-described content will be omitted to avoid redundancy.

According to embodiments, the RFFE 120E may include the mixer 630 including a first mixer element 631 and a second mixer element 632.

In more detail, the RFFE 120E may include the mixer 630 including a first input node IN1 and a second input node IN2 corresponding to the first mixer element 631 and the second mixer element 632, respectively.

In this case, for example, the mixer 630 may be called a double balanced mixer (DBM) including two mixer elements 631 and 632.

The mixer 630 according to embodiments may minimize (or reduce) spur components generated from a local oscillator (LO) by using the plurality of mixer elements 631 and 632.

Additionally, the mixer 630 may use the plurality of mixer elements 631 and 632 to reduce the size of a signal leaking through the mixer 630 among the signals output from the local oscillator (LO).

In addition, the attenuator circuit 220E may include at least one resistor disposed on the first path P1 connected between a first output node ON1 of the amplifier circuit 210 and the first input node IN1 of the mixer 630.

For example, the attenuator circuit 220E may include the plurality of resistors R1 to Rn connected in series with each other on the first path P1 that is connected between the first output node ON1 of the amplifier circuit 210 and the first input node IN1 of the mixer 630.

In addition, the attenuator circuit 220E may include at least one transistor disposed on the second path P2 connected between the first output node ON1 of the amplifier circuit 210 and the first input node IN1 of the mixer 630.

For example, the attenuator circuit 220E may include the plurality of transistors TR1 to TRn connected in series to each other on the second path P2 that is connected in parallel with the first path P1 between the first output node ON1 of the amplifier circuit 210 and the first input node IN1 of the mixer 630.

In addition, the attenuator circuit 220E may include at least one additional resistor disposed on a third path P3 connected between a second output node ON2 of the amplifier circuit 210 and the second input node IN2 of the mixer 630.

For example, the attenuator circuit 220E may include a plurality of additional resistors Ra1 to Ran connected in series to each other on the third path P3 that is connected between the second output node ON2 of the amplifier circuit 210 and the second input node IN2 of the mixer 630.

In addition, the attenuator circuit 220E may include at least one additional transistor disposed on a fourth path P4 connected between the second output node ON2 of the amplifier circuit 210 and the second input node IN2 of the mixer 630.

For example, the attenuator circuit 220E may include a plurality of additional transistors TRa1 to TRan connected in series to each other on the fourth path P4 that is connected in parallel with the third path P3 between the second output node ON2 of the amplifier circuit 210 and the second input node IN2 of the mixer 630.

According to embodiments, the processor 110 may turn on the plurality of transistors TR1 to TRn when the receiving power of the RF signal RFi is less than the threshold value.

In more detail, when the receiving power of the RF signal RFi is less than the threshold value, the processor 110 may turn on the plurality of transistors TR1 to TRn such that the signal output from the first output node ON1 is directly transferred to the first input node IN1 through the second path P2.

Additionally, the processor 110 may turn on the plurality of additional transistors TRa1 to TRan when the receiving power of the RF signal RFi is less than the threshold value.

In more detail, when the receiving power of the RF signal RFi is less than the threshold value, the processor 110 may turn on the plurality of additional transistors TRa1 to TRan such that the signal output from the second output node ON2 is directly transferred to the second input node IN2 through the fourth path P4.

According to embodiments, when the receiving power of the RF signal RFi is greater than or equal to the threshold value, the processor 110 may control at least some of the plurality of transistors TR1 to TRn and the plurality of additional transistors TRa1 to TRan using the look-up table LUT such that the attenuator circuit 220E has a resistance value corresponding to the receiving power of the RF signal RFi.

In more detail, when the receiving power of the RF signal RFi is greater than or equal to the threshold value, the processor 110 may turn off at least some of the plurality of transistors TR1 to TRn and/or the plurality of additional transistors TRa1 to TRan such that the RF signal RFi is attenuated through at least some of the resistors included in the first path P1 and the third path P3.

For example, when the receiving power of the RF signal RFi is greater than or equal to the threshold value, the processor 110 may turn off at least some of the plurality of transistors TR1 to TRn and/or the plurality of additional transistors TRa1 to TRan using the look-up table LUT such that the RF signal RFi is attenuated by the gain loss stored in correspondence with the receiving power.

For example, when the receiving power of the RF signal RFi belongs to the fifth range G4, the processor 110 may turn off at least some of the plurality of transistors TR1 to TRn and/or the plurality of additional transistors TRa1 to TRan such that the RF signal RFi is attenuated by 7 dB through the attenuator circuit 220E.

Furthermore, the processor 110 may control the gain of the amplifier circuit 210 using the look-up table LUT.

According to embodiments, the processor 110 may control the gain of the amplifier circuit 210 to a gain value stored in the look-up table LUT in correspondence with the range to which the receiving power of the RF signal RFi belongs.

The processor 110 may use the look-up table LUT to increase the gain of the amplifier circuit 210 to a gain value stored in correspondence with the range to which the receiving power of the RF signal RFi belongs.

For example, when the receiving power of the RF signal RFi belongs to the fifth range G4, the processor 110 may control the gain of the amplifier circuit 210 to 31 dB.

Referring to the above-described configurations, the processor 110 according to embodiments may control the resistance value of the attenuator circuit 220E depending on the receiving power of the RF signal RFi received through the antenna 150, using the look-up table LUT.

In detail, the processor 110 may control a size of a gain at which the RF signal RFi is attenuated by the attenuator circuit 220E depending on the receiving power of the RF signal RFi received through the antenna 150, using the look-up table LUT.

Furthermore, the processor 110 may use the look-up table LUT to increase the gain of the amplifier circuit 210 to a gain value stored in correspondence with the range to which the receiving power of the RF signal RFi belongs.

Therefore, the electronic device 100 according to embodiments of the present disclosure may improve the linearity of the RF signal RFi by increasing the gain of the amplifier circuit 210 while attenuating the gain of the RF signal RFi through the attenuator circuit 220E.

Additionally, the electronic device 100 may improve the signal quality (e.g., SNR) of the RF signal RFi received through the antenna 150 by increasing the gain of the amplifier circuit 210.

FIG. 7A is a circuit diagram illustrating an RFFE further including a transimpedance amplifier, according to embodiments. FIG. 7B is a graph illustrating a gain and a linearity of each RFFE configuration as a processor controls a resistance of an attenuator circuit, according to embodiments.

Referring to FIG. 7A, an RFFE 120F according to embodiments may include the amplifier circuit 210, the attenuator circuit 220, the mixer 230, and/or a transimpedance amplifier 240.

In this case, the RFFE 120F of FIG. 7A may be understood as an example of the RFFE 120 illustrated in FIG. 1B. Accordingly, the same reference numerals (or similar reference numerals) are used for components that are the same as (or similar to) the above-described components, and additional descriptions that may overlap with the above-described content will be omitted to avoid redundancy.

According to embodiments, the RFFE 120F may further include the transimpedance amplifier 240 connected to the mixer 230.

In more detail, the RFFE 120F may include the transimpedance amplifier 240 that converts the current signal output from the mixer 230 into a voltage signal so as to be output.

The transimpedance amplifier 240 according to embodiments may convert a current signal output from the mixer 230 into a voltage signal corresponding to the RF signal RFi so as to be output.

In more detail, the transimpedance amplifier 240 may output a first voltage signal Vout+ and a second voltage signal Vout− corresponding to the RF signal RFi based on the current signal output from the mixer 230.

In this case, a potential difference corresponding to the current signal output from the mixer 230 may appear between the first voltage signal Vout+ and the second voltage signal Vout−.

The transimpedance amplifier 240 according to embodiments may generate a voltage signal corresponding to the RF signal RFi based on the current signal output from the mixer 230 and may transmit the generated voltage signal to the BBIC 130.

Additionally, referring to FIGS. 7A and 7B together, the processor 110 according to embodiments may improve the noise figure of the RF signal RFi while maintaining the linearity of the RFFE 120F.

According to embodiments, the attenuator circuit 220 may be connected between the amplifier circuit 210 and the mixer 230.

In this case, for example, depending on the receiving power of the RF signal RFi received through the antenna 150, the resistance value of the attenuator circuit 220 may increase within a range below a reference resistance Rref.

In this case, an input impedance $Z_{in}$ viewed from the side of the amplifier circuit 210 may increase in proportion to the increase in the resistance value of the attenuator circuit 220. Accordingly, a voltage swing of the voltage output from the amplifier circuit 210 may increase. In addition, a gain K2 of the amplifier circuit 210 may increase.

Accordingly, when the processor 110 increases the resistance of the attenuator circuit 220 within a range below the reference resistance Rref, a linearity L2 of the amplifier circuit 210 may increase.

In contrast, when the processor 110 increases the resistance of the attenuator circuit 220A within a range above the reference resistance Rref, the gain of the amplifier circuit 210 does not increase and the linearity L2 decreases, so a linearity L1 of the transimpedance amplifier 240 (or the RFFE 120F) is decreased, thereby reducing the RF signal quality (e.g., SNR) of RFFE 120F.

Accordingly, when the processor 110 controls the resistance of the attenuator circuit 220 within a range below the reference resistance Rref, the linearity L1 of the RFFE 120F may be maintained within a specified range (e.g., 0.5 dB to −0.5 dB).

In detail, when the processor 110 increases the gain K2 of the amplifier circuit 210 within the range below the reference resistance Rref to the extent that the gain K1 of the RFFE 120F is reduced by the resistance of the attenuator circuit 220, since the noise figure may be improved while maintaining the linearity L1 of the RFFE 120F, the RF signal quality (e.g., SNR) may be improved.

Referring to the above-described configurations, the electronic device 100 may control the attenuator circuit 220 and the amplifier circuit 210 within a resistance range below the reference resistance Rref to improve the noise figure of the RF signal RFi while maintaining the linearity L1 of the RFFE 120F.

FIG. 8 is a flowchart illustrating a method for controlling an RFFE of an electronic device, according to embodiments.

Referring to FIG. 8, the processor 110 (or the electronic device 100) according to embodiments may control the gain of the attenuator circuit 220 and the amplifier circuit 210 based on the size of the receiving power of the RF signal RFi received through the antenna 150.

In more detail, the processor 110 (or the electronic device 100) may control the gain loss through the attenuator circuit 220 and the gain increase through the amplifier circuit 210, based on the size of the receiving power of the RF signal RFi received through the antenna 150.

In operation S10, the processor 110 according to embodiments may determine the receiving power of the RF signal RFi.

In more detail, the processor 110 may determine the receiving power of the RF signal RFi received through the antenna 150 using at least part of the configuration of the RFFE 120.

In operation S20, the processor 110 according to embodiments may determine whether the receiving power of the RF signal RFi is greater than or equal to a threshold value.

In more detail, the processor 110 may determine whether the receiving power of the RF signal RFi exceeds a threshold value.

In this case, the RF signal RFi having the receiving power less than the threshold value may be understood as a signal for which the electronic device 100 determines whether the RF signal RFi is received without considering the gain of the RF signal RFi.

In operation S31, when the receiving power of the RF signal RFi exceeds the threshold value, the processor 110 according to embodiments may control at least one transistor such that the attenuator circuit 220 has the resistance value corresponding to the receiving power of the RF signal RFi.

In more detail, when the receiving power of the RF signal RFi exceeds the threshold value, the processor 110 may control at least some of the plurality of transistors TR1 to TRn using the look-up table LUT such that the attenuator circuit 220 has the gain loss stored in correspondence with the range to which the receiving power of the RF signal RFi belongs.

In detail, the processor 110 may control the resistance value of the attenuator circuit 220 through at least some of the plurality of transistors TR1 to TRn such that the RF signal RFi is attenuated through the attenuator circuit 220 by the gain loss stored in correspondence with the range to which the receiving power of the RF signal RFi corresponds.

For example, when the receiving power of the RF signal RFi exceeds the threshold value, the processor 110 may turn off at least some of the plurality of transistors TR1 to TRn connected in parallel to each of the plurality of resistors R1 to Rn such that the attenuator circuit 220 has the resistance value corresponding to the receiving power of the RF signal RFi.

In detail, the processor 110 may control at least some of the plurality of transistors TR1 to TRn such that the RF signal RFi is attenuated by the gain loss stored in correspondence with the range to which the receiving power of the RF signal RFi belongs through at least some of the plurality of resistors R1 to Rn.

In contrast, in operation S32, when the receiving power of the RF signal RFi is less than the threshold value, the processor 110 according to embodiments may control at least one transistor such that the signal output from the amplifier circuit 210 is directly transmitted to the mixer 230.

In more detail, when the receiving power of the RF signal RFi is less than the threshold value, the processor 110 may control at least some of the plurality of transistors TR1 to TRn such that the amplifier circuit 210 is directly connected to the mixer 230.

For example, when the receiving power of the RF signal RFi is less than the threshold value, the processor 110 may turn on the plurality of transistors TR1 to TRn such that the amplifier circuit 210 is directly connected to the mixer 230.

Furthermore, in operation S40, the processor 110 according to embodiments may control the gain of the amplifier circuit 210 using the look-up table LUT. According to embodiments, operation S40 may be performed only in response to determining that the receiving power of the RF signal is greater than or equal to the threshold value in operation S20, but embodiments are not limited thereto. According to embodiments, operation S40 may be performed both in response to determining that the receiving power of the RF signal is greater than or equal to the threshold value, and in response to determining that the receiving power of the RF signal is less than the threshold value, in operation S20.

In more detail, the processor 110 may control the gain of the amplifier circuit 210 using a gain value stored in the look-up table LUT in correspondence with the range to which the receiving power of the RF signal RFi belongs.

The processor 110 may use the look-up table LUT to increase the gain of the amplifier circuit 210 to a gain value stored in correspondence with the range to which the receiving power of the RF signal RFi belongs.

Referring to the above-described configurations, the processor 110 according to embodiments may control the resistance value of the attenuator circuit 220 depending on a size of the receiving power of the RF signal RFi received through the antenna 150, using the look-up table LUT.

In detail, the processor 110 may control a size of a gain at which the RF signal RFi is attenuated by the attenuator circuit 220 depending on the size of the receiving power of the RF signal RFi received through the antenna 150, using the look-up table LUT.

Furthermore, the processor 110 may use the look-up table LUT to increase the gain of the amplifier circuit 210 to a gain value stored in correspondence with the range to which the receiving power of the RF signal RFi belongs.

Therefore, the electronic device 100 according to embodiments of the present disclosure may improve the linearity of the RF signal RFi by increasing the gain of the amplifier circuit 210 while attenuating the gain of the RF signal RFi through the attenuator circuit 220.

In addition, the electronic device 100 may improve the noise figure of the RF signal RFi received through the antenna 150 by increasing the gain of the amplifier circuit 210, thereby improving the signal quality (e.g., SNR). According to embodiments, the method described in connection with FIG. 8 may be repeated for each of a plurality of received RF signals.

FIG. 9 is a flowchart illustrating a method for controlling a gain of an amplifier circuit, according to embodiments.

Referring to FIG. 9, the processor 110 (or the electronic device 100) according to embodiments may control the gain of the amplifier circuit 210 using the look-up table LUT stored in advance.

In more detail, the processor 110 may control the gain of the amplifier circuit 210 depending on the size of the receiving power of the RF signal RFi using the look-up table LUT.

In operation S41, the processor 110 according to embodiments may identify the first range to which the receiving power of the RF signal RFi corresponds. According to embodiments, operations S41 may be performed following performance of operation S31 discussed in connection with FIG. 8.

According to embodiments, the look-up table LUT may include the plurality of ranges G0 to G8 with respect to the receiving power of the RF signal RFi.

Accordingly, the processor 110 may identify the first range corresponding to the receiving power of the RF signal RFi received through the antenna 150 among the plurality of ranges G0 to G8 with respect to the receiving power stored in the look-up table LUT.

Additionally, in operation S42, the processor 110 according to embodiments may control the gain of the amplifier circuit 210 to a first gain value. According to embodiments, operations S41 and S42 may collectively correspond to operation S40 discussed in connection with FIG. 8.

In more detail, the processor 110 may control the gain of the amplifier circuit 210 to the first gain value corresponding to the first range to which the receiving power of the RF signal RFi corresponds.

The processor 110 may control the gain of the amplifier circuit 210 to the first gain value stored in the look-up table LUT in correspondence with the first range to which the receiving power of the RF signal RFi corresponds.

For example, when the receiving power of the RF signal RFi belongs to the fifth range G4 in the look-up table LUT, the processor 110 may control the gain of the amplifier circuit 210 to 31 dB.

Referring to the above-described configurations, the processor 110 according to embodiments may increase the gain of the amplifier circuit 210 to the gain value stored in correspondence with the range to which the receiving power of the RF signal RFi belongs, using the look-up table LUT.

Through this, the electronic device 100 according to embodiments of the present disclosure may improve the signal quality (e.g., SNR) of the RF signal RFi received through the antenna 150.

FIG. 10 is a block diagram illustrating an IoT device including an electronic device, according to embodiments.

Referring to FIG. 10, an Internet of Things (IoT) may refer to a network between things using wired and/or wireless communication. An IoT device may include an accessible wired or/and wireless interface and may include devices that communicate with at least one or more other devices through the wired or/and wireless interface to transmit or receive data. The accessible interface that the IoT device includes may include a modem communication interface that is accessible to a local area network (LAN), a wireless local area network (WLAN) such as a wireless fidelity (Wi-Fi), a wireless personal area network (WPAN) such as Bluetooth, a wireless universal serial bus (USB), a Zigbee, a near field communication (NFC), a radio frequency identification (RFID), a power line communication (PLC), and/or mobile cellular networks such as 3rd generation (3G), long term evolution (LTE), 4th generation (4G), and/or 5th generation (5G). The Bluetooth interface may support Bluetooth low energy (BLE).

In detail, an IoT device 1000 may include a communication interface 1020 for communicating with the outside (e.g., another device outside of the IoT device 1000). The communication interface 1020 may be, for example, a modem communication interface that is accessible to the local area network (LAN), a wireless local area network communication interface such as Bluetooth, Wi-Fi, or Zigbee, or a mobile communication network such as PLC, 3G, LTE, 4G, or 5G.

The IoT device 1000 according to embodiments may be understood to include the same configuration as (or a similar configuration to) the electronic device 100 illustrated in FIG. 1A.

The communication interface 1020 may include a transmitter and/or a receiver.

In this case, the communication interface 1020 illustrated in FIG. 10 may be understood to include at least a portion of the antenna 150, the RFFE 120, and/or the BBIC 130 illustrated in FIG. 1A.

The IoT device 1000 may transmit and/or receive information from an access point or a gateway through the transmitter and/or the receiver. Also, the IoT device 1000 may communicate with a user device or any other IoT device to transmit and/or receive control information or data of the IoT device 1000.

The IoT device 1000 may include a processor 1010 for performing calculations.

In this case, the processor 1010 illustrated in FIG. 10 may be referred to as having the same configuration as (or a similar configuration to) the processor 110 illustrated in FIG. 1A.

According to embodiments, the processor 1010 may control the attenuator circuit 220 and/or the amplifier circuit 210 to control the path gain of the RF signal RFi received through the antenna 150.

In more detail, the processor 110 may use the look-up table LUT stored in advance to control the gain loss through the attenuator circuit 220 and a gain increase through the amplifier circuit 210 depending on the size of the receiving power of the RF signal RFi.

Through this, the IoT device 1000 (or the electronic device 100) may improve the signal quality of the RF signal RFi received through the antenna 150.

The IoT device 1000 may have a built-in battery to supply internal power or may further include a power supply unit that receives power from an external source. In addition, the IoT device 1000 may include a display 1040 for displaying internal status or data. A user may control the IoT device 1000 through a user interface (UI) of the display 1040 of the IoT device 1000. The IoT device 1000 may transmit an internal state and/or data to the outside through the transmitter and may receive a control command and/or data from the outside through the receiver.

A memory 1030 may store control instruction codes, control data, or user data that control the IoT device 1000. The memory 1030 may include at least one of a volatile memory or a nonvolatile memory. The nonvolatile memory may include at least one of various memories such as a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (ReRAM), and/or a ferroelectric RAM (FRAM). The volatile memory may include at least one of various memories such as a dynamic RAM (DRAM), a static RAM (SRAM), and/or a synchronous DRAM (SDRAM).

The IoT device 1000 may further include a storage device. The storage device may include at least one of nonvolatile media such as a hard disk drive (HDD), a solid state drive (SSD), an embedded multi-media card (eMMC), and/or universal flash storage (USF). The storage device may store user information provided through an input/output (I/O) unit 1050 and/or sensing information collected through a sensor 1060.

FIG. 11 is a block diagram illustrating a mobile terminal to which an electronic device according to embodiments is applied.

Referring to FIG. 11, a mobile terminal 1100 may include a processor 1200, a memory 1300, a display 1400, and/or a radio frequency module (RF module) 1510. In addition, the mobile terminal 1100 may further include various components such as a lens, a sensor, an audio module, etc.

The processor 1200 may be implemented as a system on chip (SoC), and may include a central processing unit (CPU) 1210, a RAM 1220, a power management unit (PMU) 1230, a memory interface 1240, a display controller (DCON) 1250, a MODEM 1260, and/or a bus 1270. In addition, the processor 1200 may further include various intellectual properties. The processor 1200, but is not limited thereto, may be referred to as a "ModAP" as the function of a MODEM chip is integrated therein.

In this case, the processor 1200 (or the CPU 1210) illustrated in FIG. 11 may be referred to as having the same configuration as (or a similar configuration to) the processor 110 illustrated in FIG. 1A.

The CPU 1210 may control overall operations of the processor 1200 and the mobile terminal 1100. The CPU 1210 may control an operation of each component of the processor 1200. In addition, the CPU 1210 may be implemented with a multi-core. The multi-core may be one computing component having two or more independent cores.

The RAM 1220 may temporarily store programs, data, or instructions. For example, the programs and/or data stored in the memory 1300 may be temporarily stored in the RAM 1220 under control of the CPU 1210 or depending on a booting code. The RAM 1220 may be implemented with a DRAM or an SRAM.

The PMU 1230 may manage power of each component of the processor 1200.

The PMU 1230 may also determine an operating situation of each component of the processor 1200 and may control an operation thereof.

The memory interface 1240 may control overall operations of the memory 1300 and may control data exchange of the memory 1300 and each component of the processor 1200. Depending on a request of the CPU 1210, the memory interface 1240 may write data in the memory 1300 or may read data from the memory 1300.

The display controller 1250 may provide the display 1400 with image data to be displayed on the display 1400. The display 1400 may be implemented as a flat panel display, such as a liquid crystal display (LCD) or an organic light emitting diode (OLED), or a flexible display.

For wireless communication, the MODEM 1260 may modulate data to be transmitted so as to be appropriate for a wireless environment and may recover received data.

The MODEM 1260 may perform digital communication with the RF module 1510.

The RF module 1510 may convert a high-frequency signal received through the antenna 150 into a low-frequency signal and may transmit the converted low-frequency signal to the MODEM 1260. In addition, the RF module 1510 may convert a low-frequency signal received from the MODEM 1260 into a high-frequency signal and may transmit the converted high-frequency signal to the outside of the mobile terminal 1100 through an antenna. The RF module 1510 may amplify or filter a signal.

In this case, the RF module 1510 illustrated in FIG. 11 may be referred to as having the same configuration as (or a similar configuration to) the electronic device 100 (or the RFFE 120) illustrated in FIG. 1A. Therefore, the RF module 1510 may include the amplifier circuit 210, the attenuator circuit 220, and/or the mixer 230.

The processor 1200 (or the CPU 1210) may control the path gain of the RF signal RFi received by the mobile terminal 1100 through the antenna 150.

In more detail, the processor 1200 (or the CPU 1210) may control the configurations of the amplifier circuit 210 and the attenuator circuit 220 to increase the gain of the RF signal RFi amplified through the amplifier circuit 210.

Through this, the processor 1200 (or the mobile terminal 1100) may improve the signal quality of the RF signal RFi received through the antenna 150.

As described above, the processor 110 according to embodiments of the present disclosure may control the resistance value of the attenuator circuit 220 depending on the receiving power of the RF signal RFi received through the antenna 150 using the look-up table LUT.

In detail, the processor 110 may control a size of a gain at which the RF signal RFi is attenuated by the attenuator circuit 220 depending on the receiving power of the RF signal RFi received through the antenna 150, using the look-up table LUT.

Furthermore, the processor 110 may use the look-up table LUT to increase the gain of the amplifier circuit 210 to a gain value stored in correspondence with the range to which the receiving power of the RF signal RFi belongs.

Therefore, the electronic device 100 according to embodiments of the present disclosure may improve the linearity of the RF signal RFi by increasing the gain of the amplifier circuit 210 while attenuating the gain of the RF signal RFi through the attenuator circuit 220.

Additionally, the electronic device 100 may improve the signal quality (e.g., SNR) of the RF signal RFi received through the antenna 150 by increasing the gain of the amplifier circuit 210.

In addition, the processor 110 according to embodiments of the present disclosure may turn on at least one transistor such that the RF signal RFi is not attenuated by the attenuator circuit 220 (or the amount of attenuation is reduced) when the receiving power of the RF signal RFi is less than the threshold value.

Through this, the electronic device 100 according to embodiments of the present disclosure may minimize unnecessary gain degradation (or reduce gain degradation) caused by the attenuator circuit 220 when the RF signal RFi having lower power is received.

In addition, when the RF signal RFi having lower power is received, the electronic device 100 may minimize (or reduce) power consumption to increase the gain of the amplifier circuit 210.

According to embodiments of the present disclosure, the electronic device may improve the quality of signals received through an antenna. According to embodiments, the look-up table LUT may be stored in a memory of the electronic device 100 (e.g., the memory 1030, the memory 1300, the RAM 1220, etc.).

Conventional devices and methods for converting a signal frequency include a resistor with a fixed resistance value between an amplifier and a mixer to increase an impedance of the mixer. However, such a fixed resistance value results in excessive gain attenuation when lower-power signals are processed. Also, the conventional devices and methods are unable to sufficiently reduce noise by increasing a gain of the amplifier without also decreasing linearity. Accordingly, the conventional devices and methods are unable to sufficiently maintain or improve the quality of processed signals.

However, according to embodiments, improved devices and methods are provided for converting a signal frequency. For example, the improved devices and methods are able to adjust a resistance value between an amplifier and a mixer based on a signal power (e.g., a receiving power) of a received signal. Accordingly, the improved devices and methods are able to remove (or reduce) the resistance value when lower-power signals are processed, thereby avoiding or reducing gain attenuation. Also, the improved devices and methods may adjust the resistance value in connection with an adjusted gain value of the amplifier, thereby reducing noise without decreasing linearity (or while reducing an amount of the decrease in linearity). Accordingly, the improved devices and methods overcome the deficiencies of the conventional devices and methods to at least maintain or improve the quality of processed signals.

According to embodiments, operations described herein as being performed by the electronic device 100, the RFFE 120, the BBIC 130, the processor 110, the amplifier circuit 210, the attenuator circuit 220, the mixer 230, the first mixer element 631, the second mixer element 632, the transimpedance amplifier 240, the IoT device 1000, the communication interface 1020, the processor 1010, the I/O unit 1050, the sensor 1060, the mobile terminal 1100, the processor 1200, the RF module 1510, the CPU 1210, the PMU 1230, the memory interface 1240, the display controller 1250 and/or the MODEM 1260 may be performed by processing circuitry. The term 'processing circuitry,' as used in the present disclosure, may refer to, for example, hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The various operations of methods described above may be performed by any suitable device capable of performing the operations, such as the processing circuitry discussed above. For example, as discussed above, the operations of methods described above may be performed by various hardware and/or software implemented in some form of hardware (e.g., processor, ASIC, etc.).

The software may comprise an ordered listing of executable instructions for implementing logical functions, and may be embodied in any "processor-readable medium" for use by or in connection with an instruction execution system, apparatus, or device, such as a single or multiple-core processor or processor-containing system.

The blocks or operations of a method or algorithm and functions described in connection with embodiments disclosed herein may be embodied directly in hardware, in a software module executed by a processor, or in a combination of the two. If implemented in software, the functions may be stored on or transmitted over as one or more instructions or code on a tangible, non-transitory computer-readable medium (e.g., the memory 1030, the memory 1300, the RAM 1220, etc.). A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD ROM, or any other form of storage medium known in the art.

Embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail herein. Although discussed in a particular manner, a function or operation specified in a specific block may be performed differently from the flow specified in a flowchart, flow diagram, etc. For example, functions or operations illustrated as being performed serially in two consecutive blocks may actually be performed concurrently, simultaneously, contemporaneously, or in some cases be performed in reverse order.

It will be understood that when an element is referred to as being "connected" or "coupled" to another element, it may be directly connected or coupled to the other element or intervening elements may be present. As used herein the term "and/or" includes any and all combinations of one or more of the associated listed items.

Although terms of "first" or "second" may be used to explain various components, the components are not limited to the terms. These terms should be used only to distinguish one component from another component. For example, a "first" component may be referred to as a "second" component, or similarly, and the "second" component may be referred to as the "first" component. Expressions such as "at least one of" when preceding a list of elements, modify the entire list of elements and do not modify the individual elements of the list. For example, the expression, "at least one of a, b, and c," should be understood as including only a, only b, only c, both a and b, both a and c, both b and c, all of a, b, and c, or any variations of the aforementioned examples.

The above descriptions are specific examples for carrying out the present disclosure. Embodiments in which a design is changed simply or which are easily changed may be included in the present disclosure as well as embodiments described above. In addition, technologies that are easily changed and implemented by using the above examples may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An electronic device comprising:

an amplifier circuit configured to amplify a radio frequency (RF) signal received from an antenna, the RF signal having a receiving power;

an attenuator circuit connected between the amplifier circuit and a mixer, the attenuator circuit including at least one resistor and at least one transistor; and a processor electrically connected to the attenuator circuit and the amplifier circuit, the processor being configured to turn on a first transistor among the at least one transistor based on the receiving power being less than a threshold value, a signal output from the amplifier circuit being directly transferred to the mixer based on the first transistor being turned on, and control one or more transistors among the at least one transistor using a look-up table based on the receiving power being greater than or equal to the threshold value, the attenuator circuit having a first resistance value corresponding to the receiving power based on the control of the one or more transistors.

2. The electronic device of claim 1, wherein the look-up table includes amplifier gain values respectively corresponding to each of a plurality of receiving power ranges; and the processor is configured to control a gain of the amplifier circuit based on the receiving power being greater than the threshold value, the control of the gain of the amplifier circuit being based on a first amplifier gain value corresponding to a first receiving power range, the receiving power being within the first receiving power range, the first amplifier gain value being among the amplifier gain values, and the first receiving power range being among the plurality of receiving power ranges.

3. The electronic device of claim 1, wherein the look-up table includes gain losses respectively corresponding to each of a plurality of receiving power ranges; and the processor is configured to determine the first resistance value corresponding to the receiving power based on the gain losses.

4. The electronic device of claim 1, wherein the at least one resistor includes a plurality of resistors connected in series on a first path between the amplifier circuit and the mixer;

the at least one transistor includes a plurality of transistors on a second path between the amplifier circuit and the mixer, each respective transistor among the plurality of transistors being connected in parallel with a corresponding resistor among the plurality of resistors; and the processor is configured to turn off at least some of the plurality of transistors based on the receiving power being greater than or equal to the threshold value, the turning off of the at least some of the plurality of transistors being based on the look-up table, and the first resistance value corresponding to the receiving power based on the at least some of the plurality of transistors being turned off.

5. The electronic device of claim 1, wherein the at least one resistor includes a first variable resistor; and the processor is configured to turn off the at least one transistor based on the receiving power being greater than or equal to the threshold value, and control a second resistance value of the first variable resistor to be the first resistance value corresponding to the receiving power.

6. The electronic device of claim 1, wherein the at least one resistor includes a first resistor and a second resistor;

the at least one transistor includes a second transistor and a third transistor, the first resistor and the second transistor being connected in series, the second resistor being connected in parallel with the first resistor and the second transistor, and the third transistor being connected in series with the second resistor; and the processor is configured to turn off the first transistor based on the receiving power being greater than or equal to the threshold value, and turn on at least one among the second transistor or the third transistor such that the attenuator circuit has the first resistance value corresponding to the receiving power based on the receiving power being greater than or equal to the threshold value.

7. The electronic device of claim 6, wherein the processor is configured to:

turn off the second transistor and the third transistor based on the receiving power being less than the threshold value.

8. The electronic device of claim 1, wherein the at least one resistor is on a first path connected between a first output node of the amplifier circuit and a first input node of the mixer;

the at least one transistor is on a second path separate from the first path, the second path both being between a first output node and a first input node; and the attenuator circuit includes at least one additional resistor on a third path connected between a second output node of the amplifier circuit and a second input node of the mixer, and at least one additional transistor on a fourth path separate from the third path, the fourth path being between the second output node and the second input node.

9. The electronic device of claim 8, wherein the processor is configured to:

control one or more transistors among the at least one transistor and the at least one additional transistor using the look-up table based on the receiving power being greater than or equal to the threshold value, the attenuator circuit having the first resistance value corresponding to the receiving power based on the control of the one or more transistors among the at least one transistor and the at least one additional transistor; and turn on a first additional transistor among the at least one additional transistor based on the receiving power being less than the threshold value, a signal output from the second output node being directly transferred to the second input node through the fourth path based on the first additional transistor being turned on.

10. The electronic device of claim 1, further comprising:

a transimpedance amplifier (TIA) configured to convert a current output from the mixer into a voltage signal corresponding to the current, and transmit the voltage signal to a base band integrated circuit (BBIC); and the BBIC connected to the transimpedance amplifier.

11. A method of controlling radio frequency front end (RFFE), the method comprising:

determining a first receiving power of a first RF signal received through an antenna;

determining a second receiving power of a second RF signal received through the antenna;

controlling at least one transistor included in an attenuator circuit such that a signal output from an amplifier circuit is directly transferred to a mixer in response to determining the first receiving power is less than a threshold value, the signal output from the amplifier circuit being the first RF signal amplified by the amplifier circuit;

controlling the at least one transistor using a look-up table in response to determining the second receiving power is greater than or equal to the threshold value, the controlling causing the attenuator circuit to have a resistance value corresponding to the second receiving power; and controlling a gain of the amplifier circuit to have a gain value corresponding to the first receiving power using the look-up table.

12. The method of claim 11, wherein the at least one transistor includes a plurality of transistors; and the controlling of the at least one transistor using the look-up table in response to determining the second receiving power is greater than or equal to the threshold value includes turning off one or more among the plurality of transistors such that the attenuator circuit has the resistance value corresponding to the second receiving power, each respective transistor among the plurality of transistors being connected in parallel with a corresponding resistor among a plurality of resistors in the attenuator circuit.

13. The method of claim 12, wherein the controlling of the at least one transistor in response to determining the first receiving power is less than the threshold value includes turning on the plurality of transistors such that the amplifier circuit is directly connected to the mixer.

14. The method of claim 12, wherein the look-up table includes a plurality of receiving power ranges corresponding to receiving powers of received RF signals, gain losses corresponding to attenuation through the attenuator circuit, and amplifier gain values corresponding to amplification through the amplifier circuit, each of the plurality of receiving power ranges corresponding to a respective gain loss among the gain losses and a respective amplifier gain value among the amplifier gain values; and the controlling of the at least one transistor using a look-up table in response to determining the second receiving power is greater than or equal to the threshold value includes determining the resistance value corresponding to the second receiving power based on the gain losses.

15. The method of claim 14, wherein the controlling of the gain of the amplifier circuit includes:

identifying a first receiving power range to which the first receiving power corresponds among the plurality of receiving power ranges; and controlling the gain of the amplifier circuit to have a first amplifier gain value corresponding to the first receiving power range among the amplifier gain values in the look-up table.

16. An electronic device comprising:

an amplifier circuit configured to amplify an RF signal received through an antenna;

an attenuator circuit including a plurality of resistors and a plurality of transistors, the plurality of resistors being connected between the amplifier circuit and a mixer, and each respective transistor among the plurality of transistors being connected in parallel with a corresponding resistor among the plurality of resistors; and a processor electrically connected to the attenuator circuit and the amplifier circuit, the processor being configured to turn off at least one among the plurality of transistors using a look-up table based on a receiving power of the RF signal being greater than or equal to a threshold value, the amplifier circuit and the mixer being connected through at least one among the plurality of resistors based on the at least one among the plurality of transistors being turned off, a combined resistance of the at least one among the plurality of resistors corresponding to the receiving power, and control a gain of the amplifier circuit to have a first gain value corresponding to the receiving power using the look-up table.

17. The electronic device of claim 16, wherein the processor is configured to turn on the plurality of transistors based on the receiving power being less than the threshold value such that the amplifier circuit is directly connected to the mixer.

18. The electronic device of claim 16, wherein the attenuator circuit has a resistance value corresponding to the receiving power based on the at least one among the plurality of transistors being turned off.

19. The electronic device of claim 18, wherein the look-up table includes a plurality of receiving power ranges corresponding to receiving powers of received RF signals, gain losses corresponding to attenuation through the attenuator circuit, and amplifier gain values corresponding to amplification through the amplifier circuit, each of the plurality of receiving power ranges corresponding to a respective gain loss among the gain losses and a respective amplifier gain value among the amplifier gain values.

20. The electronic device of claim 19, wherein the processor is configured to:

identify a first receiving power range to which the receiving power corresponds among the plurality of receiving power ranges based on the receiving power being greater than or equal to the threshold value; and control a gain of the amplifier circuit to have a first gain value corresponding to the first receiving power range among the amplifier gain values in the look-up table.

* * * * *